United States Patent
Kumar et al.

(10) Patent No.: US 11,072,258 B2
(45) Date of Patent: Jul. 27, 2021

(54) METHOD FOR PREDICTING BATTERY LIFE

(71) Applicant: Ford Global Technologies, LLC, Dearborn, MI (US)

(72) Inventors: Pankaj Kumar, Dearborn, MI (US); Imad Hassan Makki, Dearborn Heights, MI (US); Fakhreddine Landolsi, Canton, MI (US); Mark Eifert, Frankfurt (DE); Sheida Malekpour, Dearborn, MI (US); David W. Linden, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 338 days.

(21) Appl. No.: 15/837,489

(22) Filed: Dec. 11, 2017

(65) Prior Publication Data

US 2019/0176639 A1   Jun. 13, 2019

(51) Int. Cl.
| | |
|---|---|
| *B60L 58/16* | (2019.01) |
| *G07C 5/08* | (2006.01) |
| *G01R 31/392* | (2019.01) |
| *G01R 31/382* | (2019.01) |
| *B60L 58/12* | (2019.01) |
| *B60L 3/00* | (2019.01) |

(52) U.S. Cl.
CPC ............ *B60L 58/16* (2019.02); *B60L 3/0061* (2013.01); *B60L 58/12* (2019.02); *G01R 31/382* (2019.01); *G01R 31/392* (2019.01); *G07C 5/0808* (2013.01); *G07C 5/0825* (2013.01); *G07C 5/0841* (2013.01)

(58) Field of Classification Search
CPC combination set(s) only.
See application file for complete search history.

(56) References Cited

U.S. PATENT DOCUMENTS

| | | | |
|---|---|---|---|
| 6,621,250 B1 * | 9/2003 | Ohkubo | F02N 11/0825 320/136 |
| 8,519,674 B2 | 8/2013 | Anderson et al. | |
| 8,676,482 B2 | 3/2014 | Uchida | |
| 8,719,195 B2 | 5/2014 | Frisch et al. | |
| 8,972,213 B2 | 3/2015 | Zhang et al. | |

(Continued)

OTHER PUBLICATIONS

Ruetschi, P., "Aging mechanisms and service life of lead-acid batteries," Journal of Power Sources, vol. 127, No. 1-2, Mar. 10, 2004, Available Online Dec. 6, 2003, 12 pages.

(Continued)

*Primary Examiner* — Redhwan K Mawari
(74) *Attorney, Agent, or Firm* — Geoffrey Brumbaugh McCoy Russell LLP

(57) ABSTRACT

Methods and systems are provided for reliably providing a prognosis of the life-expectancy of a vehicle battery. A state of degradation of the battery is predicted based on a rate of convergence of a metric, that is derived from a sensed vehicle operating parameter, towards a defined threshold, determined based on past history of the metric. The predicted state of degradation is then converted into an estimate of time or distance remaining before the component needs to serviced, and displayed to the vehicle operator. Vehicle control and communication strategies may be defined with respect to the predicted state of degradation.

6 Claims, 14 Drawing Sheets

(56) References Cited

U.S. PATENT DOCUMENTS

| | | | |
|---|---|---|---|
| 2001/0006906 A1* | 7/2001 | Hunt | G01R 31/367 |
| | | | 455/572 |
| 2002/0026252 A1 | 2/2002 | Wruck et al. | |
| 2003/0184307 A1 | 10/2003 | Kozlowski et al. | |
| 2007/0173991 A1* | 7/2007 | Tenzer | G07C 5/008 |
| | | | 701/31.4 |
| 2013/0193753 A1* | 8/2013 | Brey | B60R 16/0231 |
| | | | 307/10.7 |
| 2014/0195128 A1* | 7/2014 | Tsumori | F02D 29/02 |
| | | | 701/51 |
| 2014/0349157 A1* | 11/2014 | Lang | H01M 10/425 |
| | | | 429/90 |
| 2016/0097821 A1 | 4/2016 | Eifert et al. | |
| 2016/0103188 A1 | 4/2016 | Eifert et al. | |
| 2016/0308259 A1 | 10/2016 | Eifert et al. | |
| 2016/0332533 A1 | 11/2016 | Tistle et al. | |
| 2016/0349330 A1* | 12/2016 | Barfield, Jr. | G07C 5/008 |
| 2016/0377686 A1* | 12/2016 | Uchida | G01R 31/3648 |
| | | | 702/63 |
| 2017/0003356 A1* | 1/2017 | Kaib | A61N 1/3708 |
| 2017/0174157 A1* | 6/2017 | Deljevic | B60L 58/12 |
| 2017/0229884 A1* | 8/2017 | Tosch | H02J 7/0031 |
| 2017/0278312 A1* | 9/2017 | Minster | G05D 1/0297 |
| 2019/0176639 A1* | 6/2019 | Kumar | B60L 58/12 |

OTHER PUBLICATIONS

"BU-806: Tracking Battery Capacity and Resistance as part of Aging," Battery University Website, Available Online at http://batteryuniversity.com/learn/article/how_age_affects_capacity_and_resistance, Available as Early as Mar. 21, 2012, Last Updated Jan. 23, 2018, 7 pages.

* cited by examiner

METHOD FOR PREDICTING BATTERY LIFE

FIELD

The present application relates to methods performed in conventional motor vehicles, hybrid vehicles, and electric vehicles for estimating the remaining life of a battery that is commonly implemented to start the vehicle and support electrical loads when the ignition is turned off. Such a battery is commonly referred to as a Starting-Lighting-And-Ignition-Battery (or SLI-Battery) in the literature. The basic method described herein may also be applied to propulsion batteries used in hybridized or electric vehicles based on Li-Ion or other technologies.

BACKGROUND AND SUMMARY

Vehicle engines include an energy storage device, such as a lead-acid battery, for powering a starter motor as well as to support electrical load transients. Such a battery is commonly referred to as an SLI-battery in the literature. A propulsion battery may also be included in a hybrid electric vehicle to power an electric motor coupled to the driveline. Batteries degrade over time and have to be serviced or replaced. The rate of degradation of a battery may be affected by multiple parameters, such as the rate of battery usage, the age of the battery, temperature conditions, the nature of the battery, etc.

Various approaches have been developed to predict the state of health of a vehicle system battery. One example approach is shown by Uchida in U.S. Pat. No. 8,676,4825. Therein the health of the battery of a hybrid vehicle is predicted based on a decrease in the fuel economy of the vehicle. Another example approach is shown by Kozlowski et al. in US 20030184307. Therein the state of health of a system battery is predicted based on the frequency of battery charging and discharging and its effects on battery parameters such as impedance, electrolyte state, etc. The battery health is then indicated in terms of a number of remaining useful cycles.

However the inventors herein have identified various issues with such approaches. As one example, there may be various mechanisms that affect a battery's health, some of which are interdependent, while others are independent of each other. The example approaches discussed above may not account for different battery characteristics that influence the battery state of health being affected at different rates based on vehicle operating conditions. For example, a battery's internal resistance may be affected more significantly during conditions that increase battery corrosion while a battery's overall capacity may be affected more significantly during conditions that increase battery sulfation or loss of active mass. Further, the effect of some of these conditions may be reversible. For example, the level of battery sulfation may increase or decrease. Furthermore, some of the characteristics may be significantly affected by temperature while others are temperature independent. If the battery end of life is predicted without accounting for all these effects, a functional battery may be required to be serviced earlier than expected. Alternatively, a degraded battery may not be sent for servicing at the right time. In either case, driver satisfaction may reduce due to the battery not starting and a resulting loss of mobility, degraded electrical functionality affecting driving performance (such as loss of electric assistance to power steering or electrically-boosted brakes), etc.

The issues may be further exacerbated in an autonomous vehicle wherein the battery (e.g., a 12V SLI battery) supports essential operating systems and safety critical systems in some modes of operation. Therein, the autonomous functions of the vehicle may be disabled or curtailed if the battery is defective or nearing its end of life. Disabling autonomous functions abruptly may cause customer dissatisfaction and inconvenience, especially if the vehicle cannot be driven manually.

In one example, some of the above issues may be addressed by a method for a battery coupled to a vehicle, comprising: predicting a state of degradation of a vehicle of a plurality of battery metrics, derived from sensed vehicle operating parameters, relative to corresponding thresholds, the thresholds determined based on past driving history data including the past history of each of the plurality of battery metrics; and converting the predicted state of degradation into a remaining time or duration estimate based on a rate of convergence towards a threshold defining the end of life for display to a vehicle operator. In this way, the remaining useful life of a vehicle battery may be more accurately predicted and the information may be conveyed to the vehicle operator in a timely manner.

As an example, a vehicle system may include a battery whose end of life is predicted using statistical and experimental methods. Based on the nature of the battery (e.g., based on the chemical composition of the battery), a plurality of battery attributes (such as a subset of all the battery attributes) that may be monitored to measure battery degradation may be identified. Further, methods for measuring the selected battery attributes, online, during vehicle operation, may be determined, including identifying the required battery sensors, sampling frequency, and algorithms required to calculate signals or metrics. For example, in the case of a lead-acid battery, at least a battery internal resistance and a battery capacity may be monitored, the battery internal resistance measured based on changes in battery voltage and current during vehicle operation, and the battery capacity measured based on internal battery resistance at low states of charge and or changes in the minimum and maximum achievable open circuit voltage (OCV) computed when the battery is completely discharged and fully charged. The measured characteristics may be normalized to temperature and battery state of charge (SOC) to account for the different effect of temperature on each battery characteristic at a given state of charge. Thresholds may then be defined, off-line, for each of the selected battery attributes based on statistical parameterization methods, past history of the given battery, vehicle driving history, battery service history, fleet data, etc. The thresholds may be temperature-independent calibratable thresholds that are also normalized to a predefined temperature and state of charge (e.g., normalized to 25° C. and 100% SOC). Based on a speed of convergence of the measured battery attributes towards their respective thresholds, an end of life of the battery may be predicted. The remaining battery life may then be displayed to the vehicle operator as a remaining number of miles of vehicle operation, a remaining number of vehicle starts, a remaining number of fuel tank refill events, etc.

In this way, the remaining life of a vehicle battery may be accurately predicted without relying on computationally intensive algorithms. By using data sensed on-board the vehicle, in association with vehicle and fleet driving statistics, the state of health of the battery may be calculated more accurately. For example, the internal resistance and capacitance of the battery may be better determined by accounting for temperature effects. The technical effect of defining thresholds for each battery characteristic based on statistical, machine-learning, and empirical methods, and estimating the battery end of life based on a trajectory of each battery characteristic towards the corresponding threshold is that the different mechanisms of battery degradation may be accounted for. For example, battery degradation due to corrosion effects may be accounted for different from battery degradation due to sulfation effects, and an overall battery health may be more reliably computed. By converting the sensed state of health into an estimate of a remaining time or duration of vehicle operation before component servicing is required, a vehicle operator may be better notified of the condition of the component. As a result, timely component servicing may be ensured, improving vehicle performance. In addition, where the battery characteristic is affected by operating driving behavior, the timely notification may enable the operator to adjust their driving behavior to extend the battery life. By predicting the remaining life of a vehicle component via a recursive estimation of statistical features, the remaining life of the component may be predicted with less computation intensity, without compromising on the accuracy of prediction. This enables a margin to be provided that better ensures healthy operation of the component for the estimated remaining life. The prognostics feature may provide an early indication of the remaining life of the battery to help a customer plan for maintenance ahead of time and avoid component failure. In addition, the convenience of online estimation may be provided in an easy to implement package.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

Figure 1A:
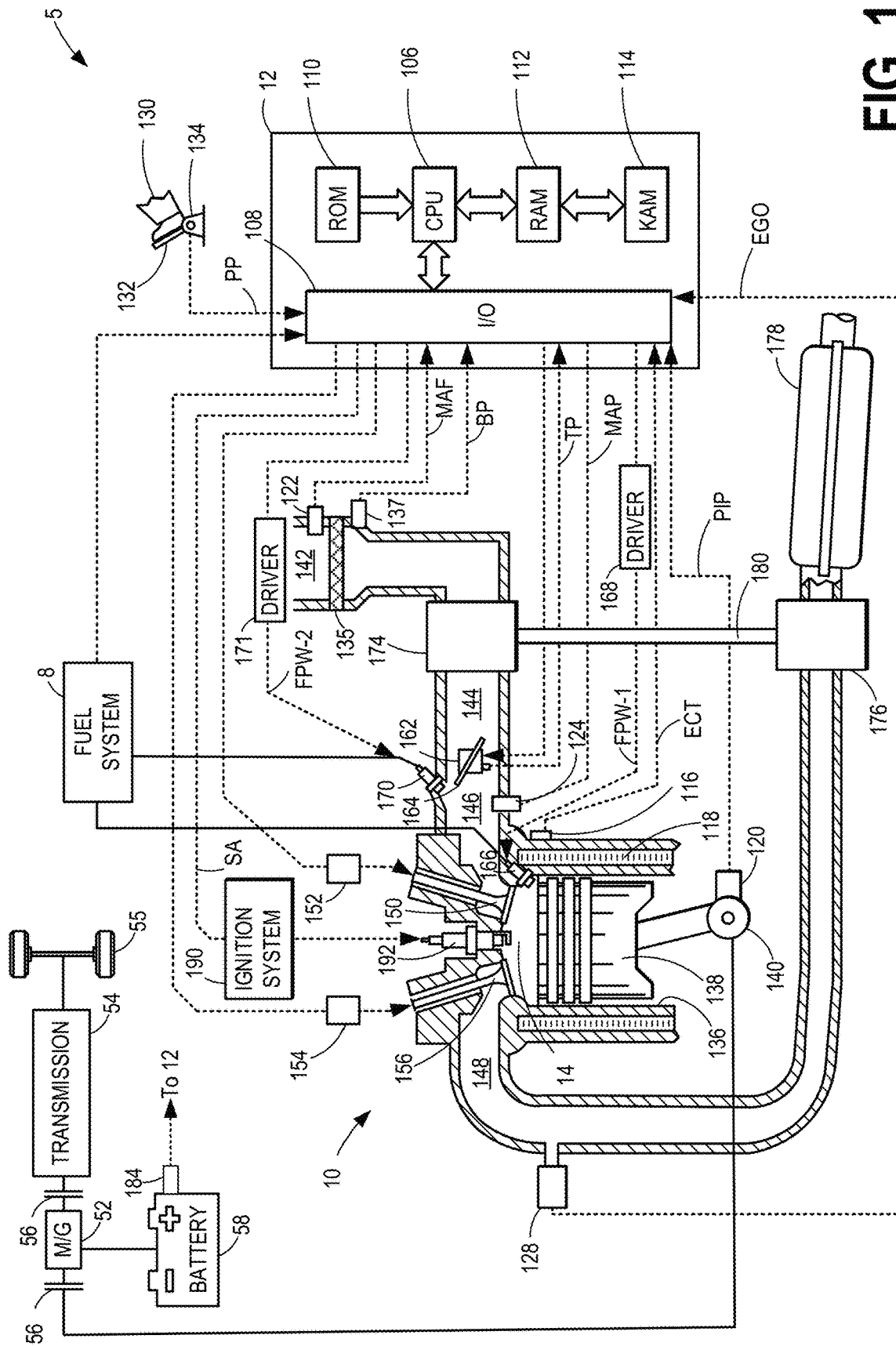
FIG. 1A schematically depicts an example embodiment of a vehicular low-voltage electrical power supply.
Figure 1B:
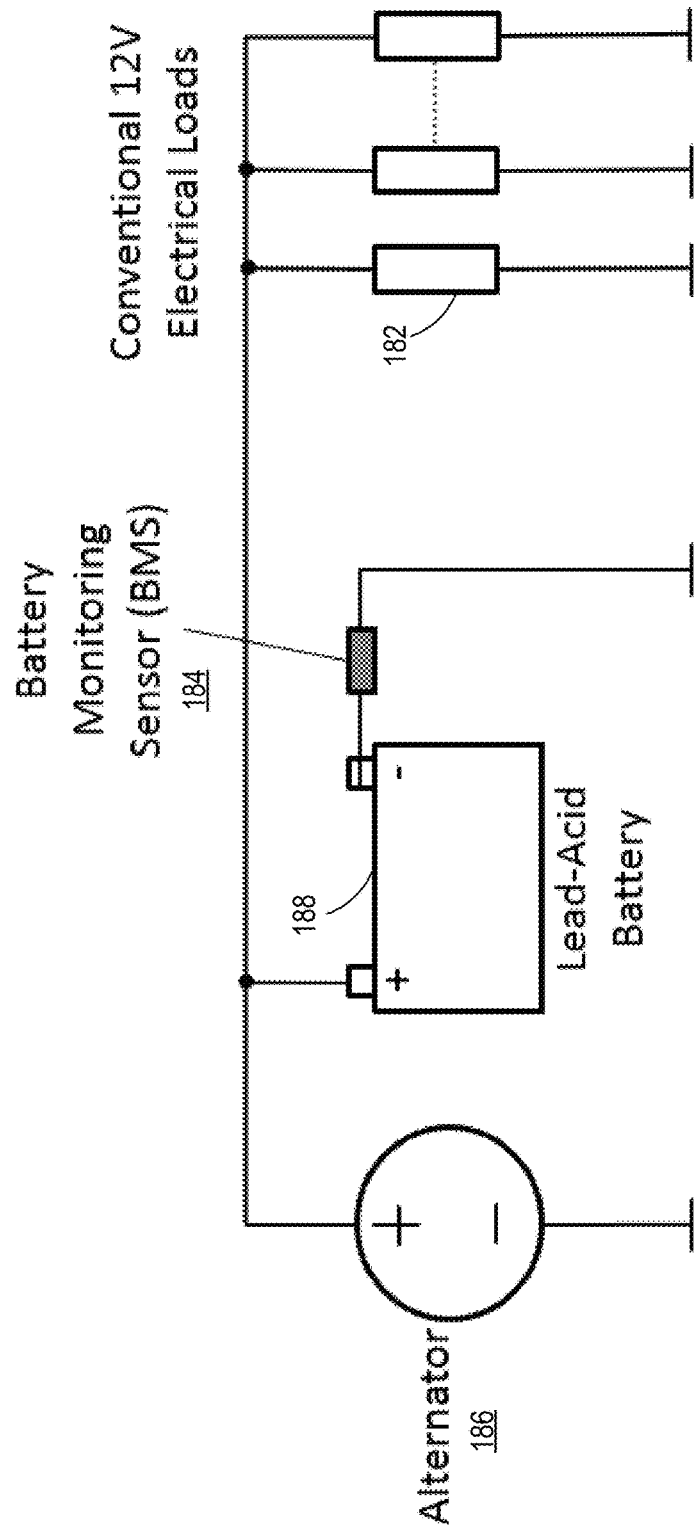
FIG. 1B shows an example embodiment of an electrical power supply system including a conventional 12V-Based alternator with a single lead-acid battery and associated battery monitoring sensor.
Figure 2:
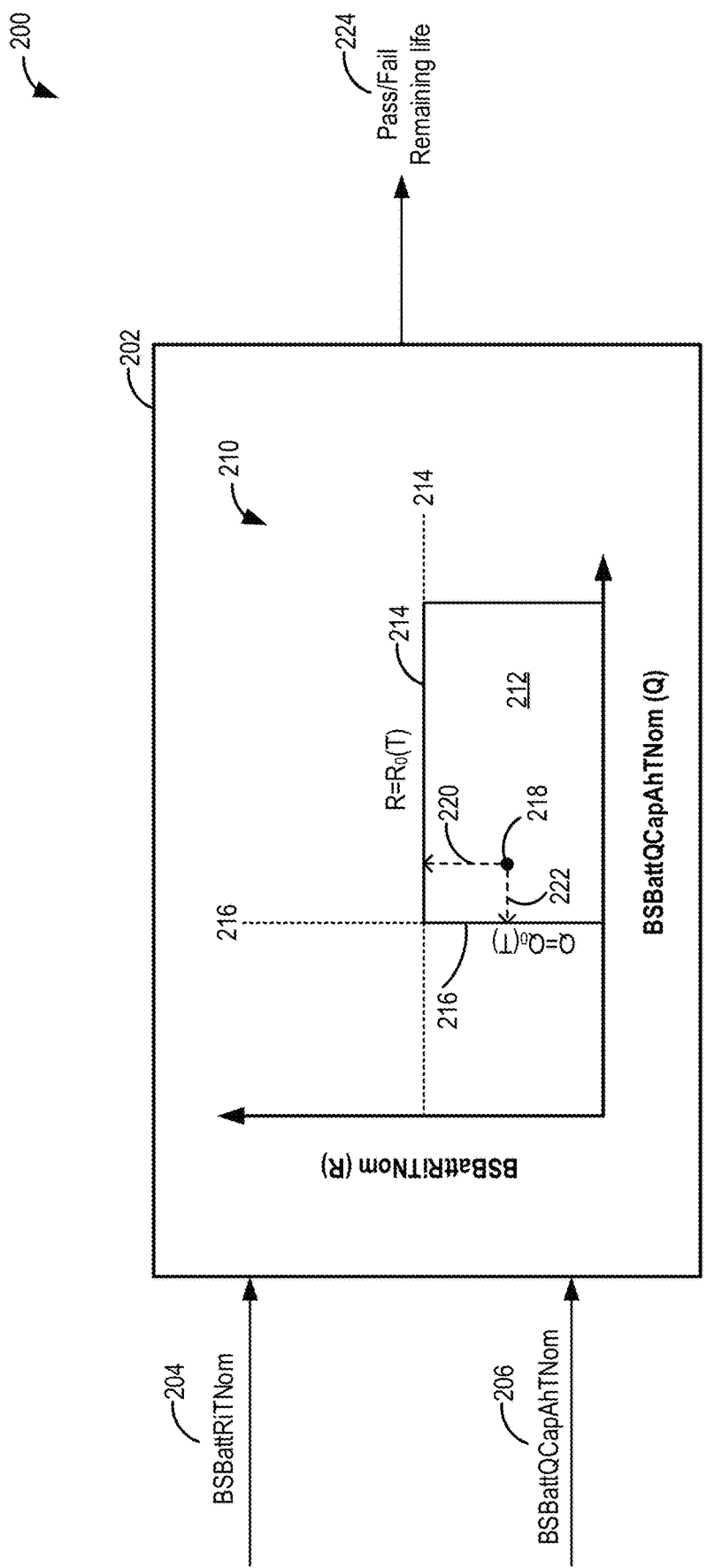
FIG. 2 shows an example end of life estimation profile for a vehicle battery.

The following description relates to systems and methods for predicting the remaining life of a battery of a vehicle system, such as the example vehicle system of FIG. 1A including the battery architecture of FIG. 1B. An on-board controller may be configured perform a control routine, such as the example routines of FIGS. 3-4, to use statistical and measured data to predict the remaining life of a vehicle battery. The controller may compare estimated battery characteristics to corresponding thresholds, as shown at FIG. 2. Further, the controller may estimate a speed of convergence of the estimated battery characteristic to the corresponding threshold, as shown at FIG. 6, to predict the end of life of the battery. The thresholds may be calibrated based on data received from the given vehicle as well as other vehicle data, as explained at FIGS. 5, 7, 10, and 12. In addition, multiple intermediate thresholds preceding the EOL may be selected. Various notifications may be sent and control actions may be undertaken as each intermediate threshold is crossed, as explained at FIGS. 8-9, 11, and 13-16. In this way, regular battery servicing may be better ensured and battery warranty issues may be reduced.

FIG. 1A depicts an example of a combustion chamber or cylinder of internal combustion engine 10. Engine 10 may be coupled in a propulsion system for on-road travel, such as vehicle system 5. In one example, vehicle system 5 may be a hybrid electric vehicle system.

Engine 10 may be controlled at least partially by a control system including controller 12 and by input from a vehicle operator 130 via an input device 132. In this example, input device 132 includes an accelerator pedal and a pedal position sensor 134 for generating a proportional pedal position signal PP. Cylinder (herein also "combustion chamber") 14 of engine 10 may include combustion chamber walls 136 with piston 138 positioned therein. Piston 138 may be coupled to crankshaft 140 so that reciprocating motion of the piston is translated into rotational motion of the crankshaft. Crankshaft 140 may be coupled to at least one drive wheel of the passenger vehicle via a transmission system. Further, a starter motor (not shown) may be coupled to crankshaft 140 via a flywheel to enable a starting operation of engine 10.

Cylinder 14 can receive intake air via a series of intake air passages 142, 144, and 146. Air received via intake air passage 142 may be filtered via air filter 135 before the air moves into air passages 144, 146. Intake air passage 146 can communicate with other cylinders of engine 10 in addition to cylinder 14. In some examples, one or more of the intake passages may include a boosting device such as a turbocharger or a supercharger. For example, FIG. 1A shows engine 10 configured with a turbocharger including a compressor 174 arranged between intake passages 142 and 144, and an exhaust turbine 176 arranged along exhaust passage 148. Compressor 174 may be at least partially powered by exhaust turbine 176 via a shaft 180 where the boosting device is configured as a turbocharger. However, in other examples, such as where engine 10 is provided with a supercharger, exhaust turbine 176 may be optionally omitted, where compressor 174 may be powered by mechanical input from a motor or the engine. A throttle 162 including a throttle plate 164 may be provided along an intake passage of the engine for varying the flow rate and/or pressure of intake air provided to the engine cylinders. For example, throttle 162 may be positioned downstream of compressor 174 as shown in FIG. 1A, or alternatively may be provided upstream of compressor 174.

Exhaust passage 148 can receive exhaust gases from other cylinders of engine 10 in addition to cylinder 14. Exhaust gas sensor 128 is shown coupled to exhaust passage 148 upstream of emission control device 178. Sensor 128 may be selected from among various suitable sensors for providing an indication of exhaust gas air/fuel ratio such as a linear oxygen sensor or UEGO (universal or wide-range exhaust gas oxygen), a two-state oxygen sensor or EGO (as depicted), a HEGO (heated EGO), a NOx, HC, or CO sensor, for example. Emission control device 178 may be a three way catalyst (TWC), NOx trap, various other emission control devices, or combinations thereof.

Each cylinder of engine 10 may include one or more intake valves and one or more exhaust valves. For example, cylinder 14 is shown including at least one intake poppet valve 150 and at least one exhaust poppet valve 156 located at an upper region of cylinder 14. In some examples, each cylinder of engine 10, including cylinder 14, may include at least two intake poppet valves and at least two exhaust poppet valves located at an upper region of the cylinder.

Intake valve 150 may be controlled by controller 12 via actuator 152. Similarly, exhaust valve 156 may be controlled by controller 12 via actuator 154. During some conditions, controller 12 may vary the signals provided to actuators 152 and 154 to control the opening and closing of the respective intake and exhaust valves. The position of intake valve 150 and exhaust valve 156 may be determined by respective valve position sensors (not shown). The valve actuators may be of the electric valve actuation type or cam actuation type, or a combination thereof. The intake and exhaust valve timing may be controlled concurrently or any of a possibility of variable intake cam timing, variable exhaust cam timing, dual independent variable cam timing or fixed cam timing may be used. Each cam actuation system may include one or more cams and may utilize one or more of cam profile switching (CPS), variable cam timing (VCT), variable valve timing (VVT) and/or variable valve lift (VVL) systems that may be operated by controller 12 to vary valve operation. For example, cylinder 14 may alternatively include an intake valve controlled via electric valve actuation and an exhaust valve controlled via cam actuation including CPS and/or VCT. In other examples, the intake and exhaust valves may be controlled by a common valve actuator or actuation system, or a variable valve timing actuator or actuation system.

Cylinder 14 can have a compression ratio, which is the ratio of volumes when piston 138 is at bottom center to top center. In one example, the compression ratio is in the range of 9:1 to 10:1. However, in some examples where different fuels are used, the compression ratio may be increased. This may happen, for example, when higher octane fuels or fuels with higher latent enthalpy of vaporization are used. The compression ratio may also be increased if direct injection is used due to its effect on engine knock.

In some examples, each cylinder of engine 10 may include a spark plug 192 for initiating combustion. Ignition system 190 can provide an ignition spark to combustion chamber 14 via spark plug 192 in response to spark advance signal SA from controller 12, under select operating modes. However, in some embodiments, spark plug 192 may be omitted, such as where engine 10 may initiate combustion by auto-ignition or by injection of fuel as may be the case with some diesel engines.

In some examples, each cylinder of engine 10 may be configured with one or more fuel injectors for providing fuel thereto. As a non-limiting example, cylinder 14 is shown including two fuel injectors 166 and 170. Fuel injectors 166 and 170 may be configured to deliver fuel received from fuel system 8. Fuel system 8 may include one or more fuel tanks, fuel pumps, and fuel rails. Fuel injector 166 is shown coupled directly to cylinder 14 for injecting fuel directly therein in proportion to the pulse width of signal FPW-1 received from controller 12 via electronic driver 168. In this manner, fuel injector 166 provides what is known as direct injection (hereafter referred to as "DI") of fuel into combustion cylinder 14. While FIG. 1A shows injector 166 positioned to one side of cylinder 14, it may alternatively be located overhead of the piston, such as near the position of spark plug 192. Such a position may improve mixing and combustion when operating the engine with an alcohol-based fuel due to the lower volatility of some alcohol-based fuels. Alternatively, the injector may be located overhead and near the intake valve to improve mixing. Fuel may be delivered to fuel injector 166 from a fuel tank of fuel system 8 via a high pressure fuel pump, and a fuel rail. Further, the fuel tank may have a pressure transducer providing a signal to controller 12.

Fuel injector 170 is shown arranged in intake passage 146, rather than in cylinder 14, in a configuration that provides what is known as port injection of fuel (hereafter referred to as "PFI") into the intake port upstream of cylinder 14. Fuel injector 170 may inject fuel, received from fuel system 8, in proportion to the pulse width of signal FPW-2 received from controller 12 via electronic driver 171. Note that a single driver 168 or 171 may be used for both fuel injection systems, or multiple drivers, for example driver 168 for fuel injector 166 and driver 171 for fuel injector 170, may be used, as depicted.

In an alternate example, each of fuel injectors 166 and 170 may be configured as direct fuel injectors for injecting fuel directly into cylinder 14. In still another example, each of fuel injectors 166 and 170 may be configured as port fuel injectors for injecting fuel upstream of intake valve 150. In yet other examples, cylinder 14 may include only a single fuel injector that is configured to receive different fuels from the fuel systems in varying relative amounts as a fuel mixture, and is further configured to inject this fuel mixture either directly into the cylinder as a direct fuel injector or upstream of the intake valves as a port fuel injector. As such, it should be appreciated that the fuel systems described herein should not be limited by the particular fuel injector configurations described herein by way of example.

Fuel may be delivered by both injectors to the cylinder during a single cycle of the cylinder. For example, each injector may deliver a portion of a total fuel injection that is combusted in cylinder 14. Further, the distribution and/or relative amount of fuel delivered from each injector may vary with operating conditions, such as engine load, knock, and exhaust temperature, such as described herein below. The port injected fuel may be delivered during an open intake valve event, closed intake valve event (e.g., substantially before the intake stroke), as well as during both open and closed intake valve operation. Similarly, directly injected fuel may be delivered during an intake stroke, as well as partly during a previous exhaust stroke, during the intake stroke, and partly during the compression stroke, for example. As such, even for a single combustion event, injected fuel may be injected at different timings from the port and direct injector. Furthermore, for a single combustion event, multiple injections of the delivered fuel may be performed per cycle. The multiple injections may be performed during the compression stroke, intake stroke, or any appropriate combination thereof.

Fuel injectors 166 and 170 may have different characteristics. These include differences in size, for example, one injector may have a larger injection hole than the other. Other differences include, but are not limited to, different spray angles, different operating temperatures, different targeting, different injection timing, different spray characteristics, different locations etc. Moreover, depending on the distribution ratio of injected fuel among injectors 170 and 166, different effects may be achieved.

Fuel tanks in fuel system 8 may hold fuels of different fuel types, such as fuels with different fuel qualities and different fuel compositions. The differences may include different alcohol content, different water content, different octane, different heats of vaporization, different fuel blends, and/or combinations thereof etc. One example of fuels with different heats of vaporization could include gasoline as a first fuel type with a lower heat of vaporization and ethanol as a second fuel type with a greater heat of vaporization. In another example, the engine may use gasoline as a first fuel type and an alcohol containing fuel blend such as E85 (which is approximately 85% ethanol and 15% gasoline) or M85 (which is approximately 85% methanol and 15% gasoline) as a second fuel type. Other feasible substances include water, methanol, a mixture of alcohol and water, a mixture of water and methanol, a mixture of alcohols, etc.

In still another example, both fuels may be alcohol blends with varying alcohol composition wherein the first fuel type may be a gasoline alcohol blend with a lower concentration of alcohol, such as E10 (which is approximately 10% ethanol), while the second fuel type may be a gasoline alcohol blend with a greater concentration of alcohol, such as E85 (which is approximately 85% ethanol). Additionally, the first and second fuels may also differ in other fuel qualities such as a difference in temperature, viscosity, octane number, etc. Moreover, fuel characteristics of one or both fuel tanks may vary frequently, for example, due to day to day variations in tank refilling.

Controller 12 is shown in FIG. 1A as a microcomputer, including microprocessor unit 106, input/output ports 108, an electronic storage medium for executable programs and calibration values shown as non-transitory read only memory chip 110 in this particular example for storing executable instructions, random access memory 112, keep alive memory 114, and a data bus. Controller 12 may receive various signals from sensors coupled to engine 10, in addition to those signals previously discussed, including measurement of inducted mass air flow (MAF) from mass air flow sensor 122; barometric pressure from BP sensor 137; engine coolant temperature (ECT) from temperature sensor 116 coupled to cooling sleeve 118; a profile ignition pickup signal (PIP) from Hall effect sensor 120 (or other type) coupled to crankshaft 140; throttle position (TP) from a throttle position sensor; and absolute manifold pressure signal (MAP) from sensor 124. Engine speed signal, RPM, may be generated by controller 12 from signal PIP. Manifold pressure signal MAP from a manifold pressure sensor may be used to provide an indication of vacuum, or pressure, in the intake manifold. The controller 12 receives signals from the various sensors of FIG. 1A and employs the various actuators of FIG. 1A to adjust engine operation based on the received signals and instructions stored on a memory of the controller. For example, based on a pulse-width signal commanded by the controller to a driver coupled to the direct injector, a fuel pulse may be delivered from the direct injector into a corresponding cylinder. Example routines that may be executed by the controller are shown with reference to FIGS. 3-4.

As described above, FIG. 1A shows only one cylinder of a multi-cylinder engine. As such, each cylinder may similarly include its own set of intake/exhaust valves, fuel injector(s), spark plug, etc. It will be appreciated that engine 10 may include any suitable number of cylinders, including 2, 3, 4, 5, 6, 8, 10, 12, or more cylinders. Further, each of these cylinders can include some or all of the various components described and depicted by FIG. 1A with reference to cylinder 14.

In some examples, vehicle 5 may be a hybrid vehicle with multiple sources of torque available to one or more vehicle wheels 55. In other examples, vehicle 5 is a conventional vehicle with only an engine, or an electric vehicle with only electric machine(s). In the example shown, vehicle 5 includes engine 10 and an electric machine 52. Electric machine 52 may be a motor or a motor/generator. Crankshaft 140 of engine 10 and electric machine 52 are connected via a transmission 54 to vehicle wheels 55 when one or more clutches 56 are engaged. In the depicted example, a first clutch 56 is provided between crankshaft 140 and electric machine 52, and a second clutch 56 is provided between electric machine 52 and transmission 54. Controller 12 may send a signal to an actuator of each clutch 56 to engage or disengage the clutch, so as to connect or disconnect crankshaft 140 from electric machine 52 and the components connected thereto, and/or connect or disconnect electric machine 52 from transmission 54 and the components connected thereto. Transmission 54 may be a gearbox, a planetary gear system, or another type of transmission. The powertrain may be configured in various manners including as a parallel, a series, or a series-parallel hybrid vehicle.

Electric machine 52 receives electrical power from a traction battery 58 to provide torque to vehicle wheels 55. Electric machine 52 may also be operated as a generator to provide electrical power to charge battery 58, for example during a braking operation.

In some examples, a battery management system (BMS) may be present on-board the vehicle, where the BMS is electrically and thermally coupled to the battery and communicates with the vehicle controller. The Battery Monitor Sensor (BMS) monitors and calculates the actual battery condition (State of charge (SOC), state of health (SOH) and state of function (SOF)). It consists of hardware and software. The hardware includes a single chip solution to measure battery voltage, battery current and temperature. These inputs are used to calculate the actual battery state. The BMS learns the battery state of the connected battery over time and keeps the actual battery state in RAM and periodically saves the learned and adapted battery parameters to non-volatile memory (NVM).

Battery 58 may also be used for various engine operation related functions. For example, battery 58 may be coupled to a starter motor (not shown) that is used to crank the engine during an engine start. Battery 58 may be implemented with Li-Ion technology. The methods described herein for predicting end of life and the associated control and communication strategies may be adapted to propulsion batteries of this type and to chemistries other than those used in lead-acid batteries as well. A battery monitoring sensor (BMS) 184 may be coupled to battery 58 for estimating one or more conditions associated with a state of degradation of the battery. Based on input from the BMS 184, controller 12 may calculate an inferred end of life of the battery, as elaborated at FIGS. 3-4.

In an alternate embodiment, such as where the vehicle is a conventional gasoline fueled engine, the engine system may include an electrical architecture such as the example architecture of FIG. 1B. Electrical system of FIG. 1B shows a conventional 12V based alternator 186 coupled to a single lead-acid battery 188. The battery may be used to power one or more conventional 12V electrical loads 182, such as an electrically assisted power steering system (EPAS), electrically boosted brakes, anti-roll control, etc. Battery 188 may be coupled to a battery monitoring sensor (BMS) 184. As elaborated herein, a state of degradation of the battery may be inferred via the BMS. In addition, a battery end of life may be calculated based on data received from the BMS. It will be appreciated that in some examples, the system of FIG. 1B may also be included in the vehicle system of FIG. 1A.

Batteries may need to be periodically serviced and diagnosed. In addition, based on their service or degradation history, the remaining life of a battery may vary. Unexpected battery failure may occur due to an incorrect estimation of the battery's end of life (EOL). For example, if a battery health monitor is not accurate, a battery's EOL may be predicted to be later than actually occurs. This can cause customer dissatisfaction due to loss of mobility (such as when the vehicle or engine does not start) as well as degraded electrical functionality affecting driving performance (such as when there is loss of assist to the EPAS). If a battery's end of life can be accurately predicted, the battery can be replaced before failure occurs. This may be particularly advantageous in the case of a vehicle system where a central controller coordinates various vehicle systems to minimize electrical power requirements. For example, in the case of an autonomous vehicle system, where there is limited interaction between a vehicle operator and the vehicle controller, the autonomous functionality may be selectively activated only if a redundant power source supplied by the battery is available. Autonomous functionality may be disabled or curtailed if a degraded battery is identified or if the end of life of the battery is predicted to occur within a short predefined time period. For example, battery low-voltage conditions may cause an electrically-assisted power steering system to lower the steering assist it provides, or to deactivate electrical functions that are not safety-critical. Other battery related issues may include excessive battery gassing which can cause disagreeable odors to be generated during vehicle operation, as well as in the garage in the case of plug-in vehicles that are charged in a garage.

In addition to the issues associated with the incorrect prediction of a battery's end of life, where the EOL is predicted to occur later than it actually occurs, there may be other issues associated with the incorrect prediction of a battery's end of life, where the EOL is predicted to occur earlier than it actually occurs. For example, an onboard battery health monitor may aggravate customers if they are alerted to a defective battery that turns out to be healthy when the vehicle is brought in for service.

The inventors herein have recognized that current battery health monitoring methodologies may only assess battery characteristics such as voltage response or internal resistance. However, batteries may fail due to multiple causes based on their use history, temperature constraints, and issues associated with the chemical nature of the battery. For example, a lead acid battery may degrade due to corrosion, sulfation, loss of active mass, etc. By using an EOL prediction methodology that assesses multiple battery characteristics associated with battery degradation, as elaborated with reference to the routines of FIGS. 3-4, reliability of the EOL prediction is improved. In addition, the scope of failure mechanisms that can be detected is expanded by relying on multiple parallel paths for failure prediction. In addition, interaction of the different characteristics can be also be accounted for (such as the effect of a rate of corrosion on a rate of sulfation of the battery, and vice versa, a rate of sulfation on the rate of corrosion of the battery). The performance of a battery in a vehicle is a function of a multitude of characteristics. If the end of life is only defined for each characteristic without taking other characteristics into account, the end time to the end of life may be over-estimated, because small degradations in multiple characteristics may cause significant degradation in total battery performance. For example, doubling the internal resistance of a battery may result in a vehicle not starting due to low voltage at the starter. Halving the battery capacity may also result in a vehicle not starting due to depletion from key-off loads. However, increasing the internal resistance by only 50% and decreasing the capacity by 25% may also hinder a vehicle from starting. It is therefore beneficial to define end of life with respect to multiple battery characteristics as illustrated in FIG. 6.

For example, the controller may identify one or more battery characteristics affecting battery health that can be measured. The controller compares the data pertaining to those characteristics, collected during vehicle operation, to corresponding thresholds. As elaborated with reference to FIGS. 3-4, the vehicle controller may define the thresholds based on battery history as well as statistical data collected from various sources such as fleet data, dealership vehicle data, warranty laboratory data, etc. The controller may be configured to use an algorithm that estimates the rate of convergence of the measured data to the defined thresholds, and uses the estimated rate in addition to a previous history of degradation behavior of the battery, sensed data for parameters relating to the battery, as well as based on mapped vehicle driving statistics (such as real-time vehicle driving statistics, or those compiled over a current vehicle drive cycle), to make a statistical prediction regarding the remaining life of the battery. The controller may then provide meaningful information regarding the battery life to the vehicle operator, such as in the form of a distance to service or time to service estimate. As a result, the remaining life expectancy of a battery may be estimated via an approach that runs online in a vehicle and whose accuracy may be enhanced by periodic parameter adaptation using battery data obtained from a fleet of vehicles in the road and batteries replaced in the service.

In this way, the components of FIGS. 1A-1B enable a vehicle system comprising an alternator driven by an engine;

a battery, sensors for measuring battery voltage and current; and a controller. The controller may be configured with computer-readable instructions stored on non-transitory memory for: predicting a state of degradation of the battery based on change in capacity and internal resistances.

FIG. 2 shows an example map 200 that may be used by a vehicle controller to monitor the end of life of a vehicle battery, such as a lead-acid battery. The approach applied in FIG. 2 may represent a minimal solution implementation of the method of FIG. 3, relying on only 2 of a plurality of measurable characteristics of the lead-acid battery but it will be appreciated that the method may be expanded to include additional characteristics.

In the example of FIG. 2, a battery internal resistance (R) and a battery capacity (Q) are monitored. The battery resistance is defined as the ratio of the change in voltage to the current as measured during cranking or other events resulting in significant voltage and current transient. The battery capacity, on the other hand, is defined as the amount of charge it can deliver at rated discharge current and temperature such that the battery terminal voltage is above a defined threshold. The starting ability of a battery could degrade due to corrosion which typically manifests as an increase in internal resistance or decrease in cold cranking amperage. Similarly, a battery could lose charging capability if it becomes sulfated or experiences a loss of active mass, both of which may manifest as a loss in capacity. Thus, by monitoring the change in internal resistance and overall capacity, a battery health can be monitored. As the battery ages, the resistance of the battery is expected to increase while the capacity is expected to decrease.

Map 200 depicts an algorithm 202 receiving input regarding a battery's internal resistance 204, BSBattRiTNom, that is normalized at 100% battery SOC and 25° C. Algorithm 202 may be stored in the memory of a vehicle controller, such as in a battery management module. The algorithm 202 also receives input regarding a battery's capacity 206, BSBattQCapAhTNom, that is normalized at 100% battery SOC and 25° C. The normalized capacity represents the amount of charge that can be removed from the battery at 25° C. when discharged from 100% battery SOC at a nominal current of I20. I20 is defined as the current magnitude obtained by dividing nominal capacity by 20. In one example, the data may be received from a battery management system (BMS) on-board the vehicle, the BMS coupled to the battery and communicatively coupled to the vehicle controller. BMS measures current, voltage and may also measure battery terminal temperature. It may use a built-in model, such as an equivalent circuit model, to infer the battery SOC, capacity and capacity loss due to sulfation and loss of active mass. Data may be collected during specific circumstances to estimate specific battery characteristics. For example, internal resistance may only be estimated when discharges occur with changes in current over time that are greater than a threshold, and loss of capacity due to sulfation may be only calculated when voltage measurements are taken when the battery has been fully charged and allowed to rest without charges and discharges of a minimum amount of time. A plausibility strategy may be put into place that only transmits estimates of battery characteristics after measurement has occurred multiple times, or an average of estimates over a defined moving time horizon may be transmitted. Some battery monitoring sensors may use extended Kalman filters to remove outliers from estimates of battery characteristics and provide stable values.

The normalized internal resistance 204 and normalized capacity 206 are plotted on map 210 to determine a current position of the battery on map 210. Further, resistance and capacity thresholds are determined to identify a region of map 210 where the battery is in a useable state of health (e.g., where a battery health monitor mass pass). For example, the controller may define a region 212 on map 210, region 212 bounded by resistance threshold 214 ($R_0$) and capacity threshold 216 ($Q_0$). As elaborated at FIG. 3, the thresholds may be determined based on various factors including sensed data, statistical data, battery service history, vehicle driving history, data retrieved from other vehicles in a fleet, other vehicles at a dealership, etc. In the depicted example, based on the data it is determined that the battery state of health is within region 212, at location 218, at a distance 220 from the resistance threshold 214 and a distance 222 from the capacity threshold 216.

Figure 3:
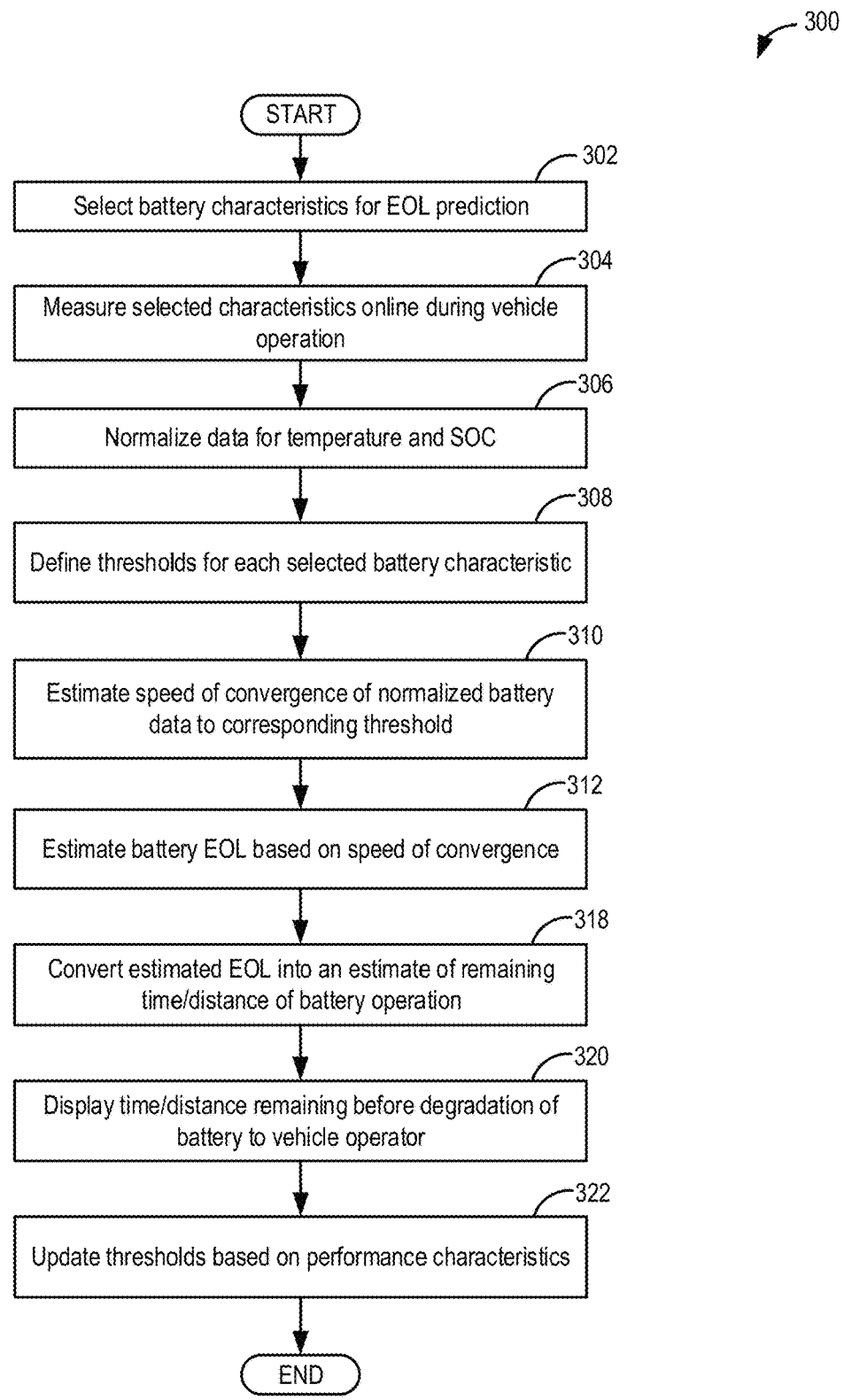
FIG. 3 shows a high level flowchart for performing prognostics and diagnostics of a vehicle battery using sensed data and statistical estimations.

Also based on the sensed and statistical data, and via an algorithm discussed at FIG. 3, the controller may estimate a speed of convergence of each parameter to the corresponding threshold, such as a speed at which the internal resistance is changing from location 218 towards resistance threshold 214, and the speed at which the internal capacity is changing from location 218 towards capacity threshold 216. Based on the estimated location and speed of convergence, the algorithm may determine a battery state of health 224 including whether the battery monitor has passed or failed (e.g., whether the battery will result in a start or non-start of the vehicle) as well as a remaining battery life (e.g., a predicted end of life estimate). The estimated battery state of health is then displayed to a vehicle operator.

It will be appreciated that while FIG. 2 depicts battery capacity monitored as a function of sulfation and active mass loss, in further examples, additional signals may be used to monitor capacity loss due to sulfation distinct from capacity loss due to active mass loss. This is because the effect of sulfation can be reversed. Further, while $R_0$ and $Q_0$ are depicted herein as temperature-independent calibratable thresholds that are normalized to predefined temperatures and states of charge, in other examples, the thresholds for battery characteristics may be temperature-independent.

Turning now to FIG. 3, an example method 300 is shown for predicting the end of life (EOL) of a vehicle battery. Instructions for carrying out method 300 and the rest of the methods included herein may be executed by a controller based on instructions stored on a memory of the controller and in conjunction with signals received from the battery-monitoring sensor as illustrated in FIGS. 1A-1B. The controller may employ actuators of the vehicle system and engine system to diagnose battery state of health, according to the methods described below. The method enables the predicting of a state of degradation of a vehicle battery based on a rate of change in value of a metric associated with the vehicle battery, from an initial value of the metric at a time of installation in the vehicle system, over a duration of vehicle travel. The predicting is further based on a distance traveled by the vehicle over the duration, the metric derived from a sensed vehicle operating parameter. The method further enables the converting of the predicted state of degradation into an estimate of time or duration remaining before the vehicle battery needs to be serviced (or replaced) for display to a vehicle operator. The method includes a learning-based high-level approach that can be applied to all types of automotive batteries including lead-acid and lithium-ion batteries. The equivalent circuit parameters are identified regularly, at fixed intervals, and are assumed to explicitly depend on the battery temperature and state of charge (SOC). In the depicted method, two generic performance metrics are applied for battery diagnostics/prognostics. They are calculated using the statistics associated with batteries that are replaced and batteries causing vehicles to break down. The metrics are used to adapt the threshold defining end of life (EOL) for each battery feature. After a threshold has been adapted, the performance metrics are used to determine whether the adaptation was sufficient. Because the battery statistics only converge to a stable value after a representative amount of batteries have been evaluated over a sufficient amount of time, a monitoring period is associated with each metric. Once the metric has been evaluated over at least the associated monitoring period, it may be used to quantify system performance and calculate further adaptations to the EOL thresholds. Other metrics to measure system performance and facilitate parameter adaption may be applied as well. Those described here may be used as prototypes for new metrics as new requirements on the battery diagnostic/prognostic system emerge.

At 302, the method includes selecting one or more battery characteristics (from a plurality of possible battery characteristics) for battery EOL prediction. The characteristics may include battery attributes that can be used to measure battery degradation. The characteristics may be selected based on the nature or configuration of the battery, computation power available on-board the vehicle for EOL prediction, as well as time constraints for EOL prediction. As an example, when the battery is a lead-acid battery, the selected characteristics may include, at a minimum, internal resistance and capacity of the battery. If additional computation power or time for estimation is available, additional lead-acid battery characteristics may be added, such as battery sulfation level distinct from loss of active mass of the battery. As another example, when the battery is a lithium-ion battery, the selected characteristics may include battery impedance or Li ion charge concentration estimated by embedded models. Additional characteristics may also be added to the prediction algorithm to include additional failure mechanisms. For example, as novel battery technologies emerge, and/or as previously unknown degradation mechanisms for existing batteries are discovered, additional characteristics may be selected. In other words, the prediction algorithm may not restricted to only use two features such as internal resistance and capacity. Additional features may be added as more information about end of life batteries is collected and as the state of the art changes. For example, additional features may be added to include new battery monitoring techniques, new battery sensors, and new information correlating battery features to battery end of life.

By increasing the number of features, when computation power is not a constraint, the accuracy of EOL prediction may be increased. Additional features that may extend the prediction may include, for example, a battery gassing rate (e.g., in grams $H_2$ per hour). Lead-acid cells give off oxygen and hydrogen when overcharged. It may be that a battery has sufficient capacity to start a plug-in vehicle but still gasses heavily in a garage when it is plugged in. As another example, a battery water loss rate (in water lost in grams/min) may be incorporated. Lead-acid cells give off oxygen and hydrogen and experience water loss when overcharged. When the water level of a battery gets too low, it may fail due to diminished capacity and high internal resistance. As yet another example, the occurrence of an internal short may be assessed (such as via a flag being set). An internal short is characterized by a severe drop in the battery's open-circuit voltage after the vehicle's power supply is switched off. This symptom may be accompanied by a high internal resistance corresponding to battery voltage and average discharge current. As still another example, loss of capacity due to sulfation may be characterized (e.g., in terms of loss of capacity in Ah due to sulfation). Sulfation is a process that causes the capacity of a battery to depreciate and a voltage level, with respect to state of charge, to sink. It is reversible to a degree by charging at a high voltage over a sustained period of time.

As yet another example, loss of Active Mass may be characterized (e.g., in terms of Loss of capacity in Ah due to loss of active mass). Loss of active mass causes the battery capacity to depreciate. As a further example, a battery Time in Service may be characterized (e.g., in terms of battery time in running vehicle expressed in hours). Statistical distributions of the life expectancy of batteries in specific vehicles may be used to predict the distance to end of life. The prediction may be improved by using statistics of specific vehicles operated in specific regions to define end of life as a function of vehicle usage. For instance, the same batteries may degrade quicker due to corrosion and water loss in a warm/hot environment versus a cold climatic condition. As still another example, charge throughput weighted with respect to Depth of Discharge may be characterized (e.g., in terms of Loss of battery capacity in Ah). Charge throughput may be weighted with respect to battery depth of discharge and integrated over time to estimate aging defined as loss of battery capacity.

Selecting the characteristics may further include selecting a method of measuring the characteristics, a sampling frequency, identifying one or more algorithms required to calculate signals or metrics from the collected data, as well as required calculation power and time. For example, if it is found that many batteries were failing due to lack of water, new advanced algorithms that measure water loss or even a water-loss sensor may be implemented. On the other hand, if many batteries fail due to grid corrosion, an equivalent circuit model may be implemented to track corrosion. The progress of corrosion in the positive electrode is correlated to changes in the values of the resistance and capacitance of an RC-pair in a standard Randle's equivalent circuit model. The RC-pair is associated with a time constant that falls in a defined range. The sampling period for voltage and current measurements may be chosen to sufficiently sample those values for an algorithm that estimates the values of the RC-pair. Those values would then be used to track corrosion.

It will be appreciated that the battery may be periodically assessed, such as based on a time or distance of vehicle travel elapsed since a last assessment of the battery. In other examples, the selection of the characteristics to assess the battery may be based on an active request received from the operator. This may be in addition to, or independent of, the periodic assessment. For example, an operator may request prognosis of a system battery before embarking on a planned travel route.

At 304, the method includes measuring the selected characteristics online during vehicle operation. For example, the selected characteristics may be measured via one or more battery sensors at the determined sampling frequency. For example, internal resistance of the battery may be measured with a hall-based or shunt-based current measurement and a voltage sensor at sampling frequencies greater than 1 kHz. As another example, a loss in battery capacity due to sulfation may be measured with a single voltage measurement after the battery has been fully charged and has been allowed to rest without charging or discharging for a number of hours. The change in open-circuit voltage of the fully charged battery as it ages is a metric for the capacity loss due to sulfation. As another example, internal shorts (and a severity of the short) may be identified based on a degree of voltage relaxation. At 306, the method includes normalizing the collected data for temperature and state of charge. For example, the data may be normalized to 25° C. and 100% SOC. In this way, data sensed on-board the vehicle may be used to determine the state of health of the battery. For example, where the determined metric is one or more of a battery resistance and a battery capacity, the sensed vehicle operating parameters may include one or more of a battery current and a battery voltage. In some examples, after sensing the one or more parameters associated with battery degradation, the controller may compare the sensed data on a current iteration of the routine to data sensed on a previous iteration of the routine to update the rate of degradation of the battery (from a base rate) in real-time. For example, the controller may predict a state of degradation of a vehicle battery based on a determined metric derived from a sensed vehicle operating parameter, including a past history of the determined metric.

At 308, the method includes defining thresholds for each of the selected battery characteristics. These are thresholds for the metrics defining the battery EOL. EOL thresholds may be determined from one or more sources including battery experts, vehicle electrical requirements cascading feature requirements to battery requirements, a fixed set of aged battery data describing features, as well as iteratively with online monitoring of feature data from end of life batteries replaced at dealerships. As one example, it may be required that a vehicle be able to be started after parking for 30 days given an initially fully charged battery with capacity $C_{New}$. After 30 days, a known battery charge is consumed by key off loads ($C_{KOL}$). End of life is determined to occur when the capacity is diminished such that $C<C_{New}-C_{KOL}$. For example, when loss of capacity is the only battery characteristic that is deteriorating, end of life may be defined when the battery capacity diminishes by 30% from its new value. The ability of a cold battery to start a vehicle may be hampered by high internal resistance. End of life may be identified if the internal resistance increases by 75% from the new value, or it may be identified if it reaches a value such as 9 milliohms.

Figure 5:
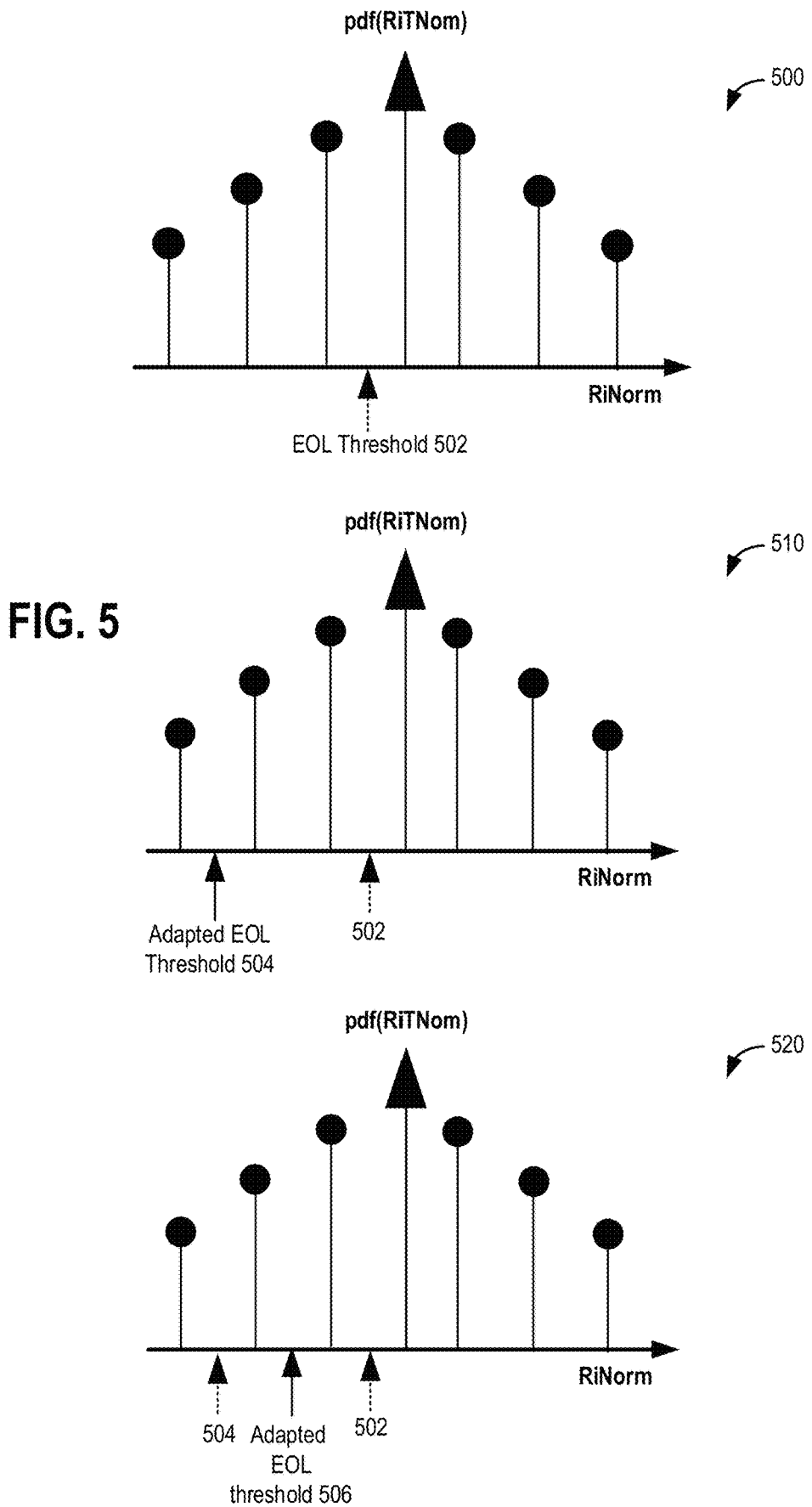
FIG. 5 shows example adjustments to an EOL threshold for a battery resistance during battery end of life prediction.
Figure 6:
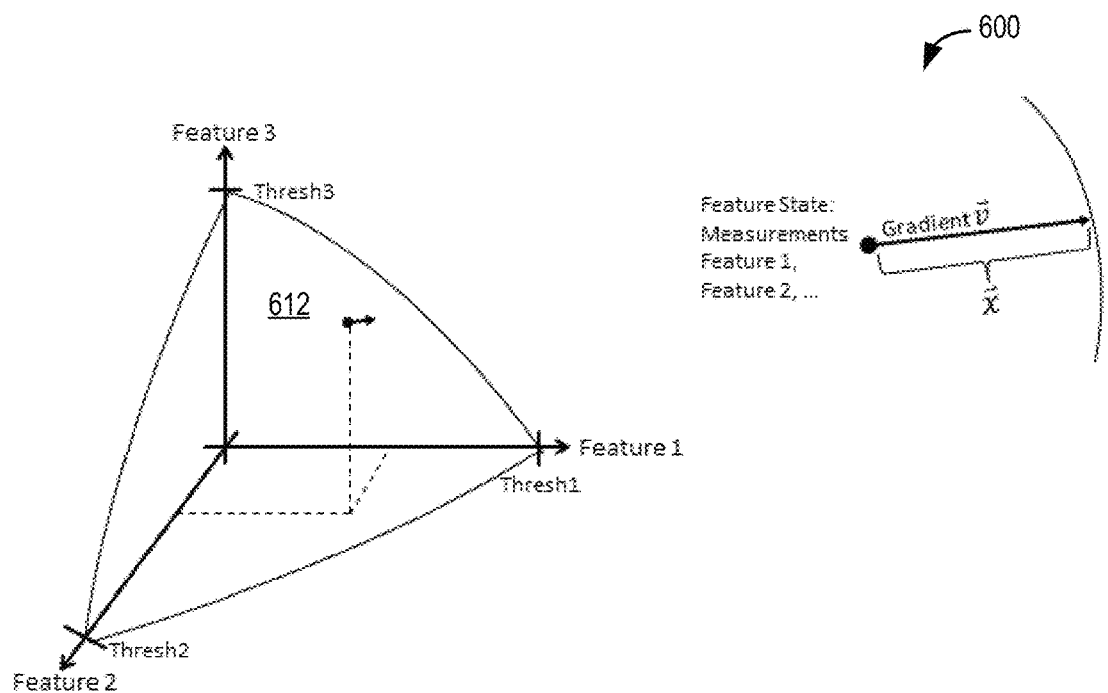
FIG. 6 depicts an example determination of a speed of convergence of a battery characteristic towards its threshold.
Figure 10:
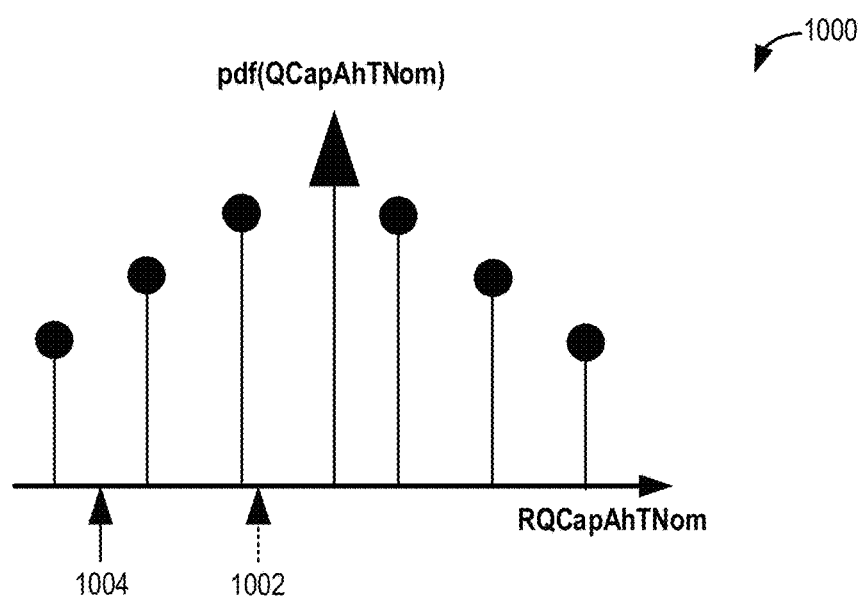
FIG. 10 shows example adjustments to an EOL threshold for a battery capacity during battery end of life prediction.

FIG. 5 shows an example of using a statistical representation of a battery feature to define a corresponding threshold during EOL prediction. In map 500, a statistical spread of the normalized internal resistance of batteries replaced by a dealership is depicted. A controller may select a threshold (dashed arrow) to correspond to a defined percentile of the population based on warranty and customer satisfaction models. For example, a resistance that corresponds to 10 percentile of the batteries replaced in a dealership may be used to identify end of life. In that case, many batteries that actually still have some service life may be replaced, but the number of customer's vehicles that do not start due to a defective battery will be small. On the other hand, a resistance corresponding to 90 percentile of batteries replaced in a dealership would be higher than a 10-percentile resistance. Choosing this value would result in allowing some batteries to continue service in vehicles even though they may fail, and as a result, the number of vehicles that are stranded due to defective batteries may increase. However, warranty costs may be lower, because batteries that are still able to remain in service would not be replaced unnecessarily. Adjusted EOL thresholds are depicted at maps 510 and 520, and described later with reference to the EOL threshold updating routine of FIG. 7.

Returning to FIG. 3, machine learning techniques for pattern recognition may also be implemented to define the thresholds. For example, pattern learning within a machine-learning framework, also referred to as Supervised Learning, may be applied. Supervised learning may define "N best category labels" for a given set of features, given the associated probabilities of each category with associated confidence levels. Category labels used with supervised learning for battery end of life prediction may include "Before (outside of) End of Life" and "At (within) End of Life." More than one feature may be used for category identification with supervised learning. One example output of supervised learning algorithm may include "There is a 78% probability that the battery is at end of life, there is a 22% probability that it is not, and the confidence level for this prediction is 90%".

There may be different classes of supervised learning algorithms for threshold calculation. For example, there may be parametric algorithms that are linear, quadratic, or rely on maximum entropy calculation. As another example, there may be Non-parametric algorithms such as those using Neural Networks or Support Vector Machines. As such, any of these algorithms may be used to calculate thresholds defining end of life. For example, a linear parametric algorithm of type Linear Discriminant Analysis may be used.

Thresholds and calibration parameters may also be updated if they are found to not deliver targeted accuracy requirements for prediction. In one example, this may occur if changes in battery technology or vehicle electrical system technology change the battery or the character of battery failure modes. An advanced architecture may use data from a large central data bank (e.g., cloud) as a source of updated thresholds and calibration parameters.

In order to adaptively optimize parameters of a diagnostic/prognostic system, it is necessary to have an infrastructure in place that facilitates measuring the characteristics of batteries that are replaced or fail in vehicles. The measurements are analyzed, and an algorithm may recalculate the thresholds defining end-of-life using performance metrics.

It will be appreciated that the algorithms may run in the cloud or on a hand-held device without a continuous data stream.

Various implementations of this architecture may be possible. A first example of such as an architecture is shown at embodiment 1200 of FIG. 12. Embodiment 1200 illustrates a generic form of the architecture where battery characteristics are collected and processed by a central entity outside of the vehicle. In the depicted example, the thresholds may be calculated at a central location (e.g., a data bank, such as in the cloud) and transmitted to the vehicle. The thresholds may be calculated at the data bank based on input received from the data bank sources (such as a vehicle BMS, dealer battery tests, warranty analysis laboratories, etc.). The thresholds are then transmitted to the on-board algorithm on the vehicle which also receives inputs from the various on-board battery monitoring sensors. The algorithm estimates the battery life further based on feature gradients stored in the controller's memory.

Figure 12:
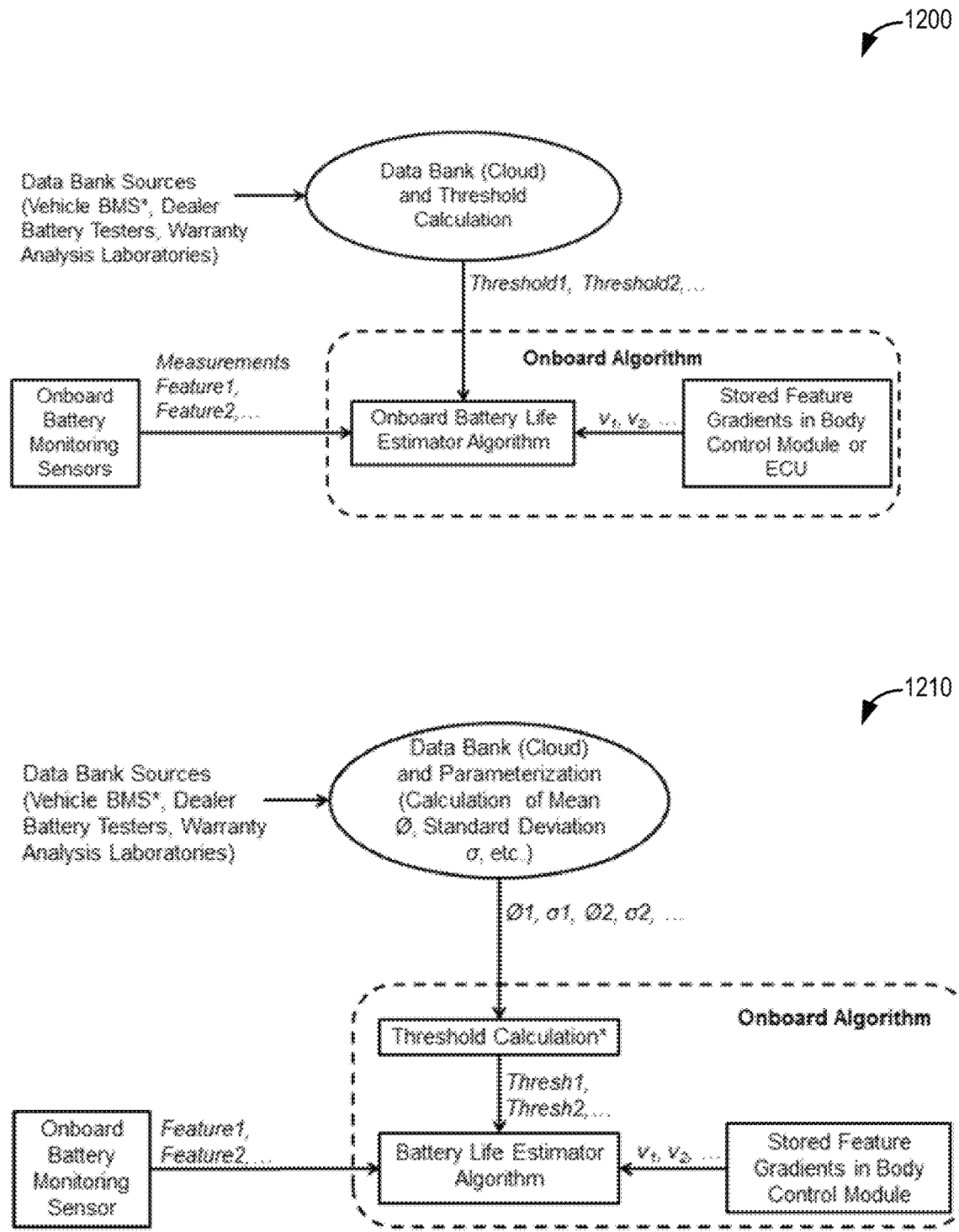
FIG. 12 shows example prognostic-diagnostic architecture that may be used for data processing and threshold calculation.

Another example is shown at embodiment 1210 of FIG. 12, wherein battery characteristics may be gathered in the central location and processed. Then, parameters describing battery data and feature statistics (e.g., mean, standard deviation, etc., of given characteristics) may be transmitted to the vehicle, and the calculation of parameters and thresholds may take place locally on-board the vehicle. Therein, pattern recognition, supervised learning, or simple characteristic of feature statistical parameterization (such as percentile) is used to determine parameters of the feature, such as mean and standard deviation of each selected battery characteristic. The parameters may be calculated at the data bank based on input received from the data bank sources (such as a vehicle BMS, dealer battery tests, warranty analysis laboratories, etc.). The parameters are then transmitted to the vehicle controller where the on-board algorithm is used to calculate the thresholds locally.

Transmission of thresholds or parameters to the vehicle may be carried out via on-board modem, through a diagnostics port, wireless communication, or through re-flashing the on-board controller (or ECU) where the prediction algorithm runs.

As discussed above, the data bank may receive inputs from various data bank sources. For example, data may be received from a Vehicle Battery Monitoring System (BMS) including a battery monitoring sensor. Therein, before a battery is replaced by a dealership, a service personnel may trigger a data collection routine that saves battery feature data. This represents a fingerprint of a battery at its end of life. The data is then transmitted to a cloud via an on-board modem or by downloading it from a diagnostic port.

As another example, data may be sources from Dealer Battery Testers. Therein, when a battery tester diagnoses a defective battery, a routine may be triggered that saves the information used for the diagnosis and possibly causes the tester to collect further information. The information is then transmitted to the cloud via a modem or by other means.

As yet another example, data may be sourced from Warranty Analysis Laboratories. Therein, a subset of batteries that are replaced in a dealership may be analyzed and torn down by laboratories for quality control. Information collected during the analysis may be transmitted to the cloud via the internet or by other means.

At 310, the method includes estimating a speed of convergence of the normalized battery data to the corresponding threshold(s). This allows the controller to infer how quickly or slowly the battery is approaching its end of life. At 312, a battery EOL may be estimated based in the speed of convergence. As an example, where the normalized internal resistance of the battery is the battery feature being monitored, the EOL threshold may be set to 6 mOhm for a given battery. The degradation of the battery as a function of rate of convergence of the internal resistance may be described by a gradient:

$$\frac{\partial RiNorm}{\partial t} = v$$

The distance to the EOL may then be described by the equation Threshold−RiNorm=x.

The remaining life may then be estimated as:

$$T = \frac{x}{v}$$

With reference to the example of FIG. 2, the present condition or state of the battery may be defined by location 218. Resistance threshold 214 ($R_0$) and capacity threshold 216 ($Q_0$) may be calibratable thresholds for internal resistance and battery capacity, as identified from aged battery data and/or advice from battery experts. The distance of the present capacity at position 218 from the threshold, herein referred to as x1 (and depicted at FIG. 2 as 222) is defined as: x1=$Q_0$−Q. The rate at which the capacity is approaching the threshold (that is, the speed of convergence) is then determined as:

$$\frac{dx1}{dt}.$$

Likewise, the distance of the present internal resistance at position 218 from the threshold, herein referred to as x2 (and depicted at FIG. 2 as 222) is defined as: x2=$R_0$−R. The rate at which the resistance is approaching the threshold (that is, the speed of convergence) is then determined as:

$$\frac{dx2}{dt}.$$

The derivatives describing the speed of convergence to a threshold may also be referred to herein as a gradient (of a corresponding feature).

Since a battery can fail due to either low capacity or high resistance, the End of life (EOL) of the battery is defined as the earliest time of failure due to either mechanism. In other words, $$EOL = \mathrm{Min}\left(\frac{x1}{v1}, \frac{x2}{v2}\right).$$

The prediction algorithm can likewise be extended to multiple features, as shown with reference to FIG. 6. While the end-of-life (EOF) prediction algorithm for lead-acid batteries depicted at FIG. 2 measures battery characteristics or features and compares them with thresholds defining the end-of-life values for the features (specifically, the features "normalized battery internal resistance" and "normalized capacity"), map 600 of FIG. 6 depicts the same for generic features.

As shown at map 600, the end of life thresholds for prediction with multiple features may not necessarily be linear bounds in the "feature space" (such as was the case in FIG. 2, see linear feature space 212). Instead, a shape of the feature space 612 may be determined by the pattern recognition/supervised learning algorithm used for their definition.

The feature-state represents the values of the features {Feature1, Feature2, . . . } or {$f_1(t)$, $f_2(t)$, $f_3(t)$, . . . , $f_N(t)$} that are being used to determine the life expectancy of the battery. They may be internal resistance and capacity or other characteristics. Each axis of feature-space corresponds to the values of a specific feature. Measurements of features at a point in time correspond to a point in feature-space. The point f(t)={$f_1(t)$, $f_2(t)$, $f_3(t)$, . . . , $f_N(t)$}, and $f_1(t)$ . . . $f_N(t)$ represents the values of the features of the battery at time t.

Map 600 also includes the gradient of the features of the battery. The gradient $$\vec{v} = \frac{\partial f}{\partial t}$$

describes the change in the feature-state (in feature-space) of the battery ∂f with respect to time in the direction of the orthonormal $\vec{x}$ (shortest path) to the end-of-life threshold in feature space.

The prediction of time to the end of life is defined as the the time remaining until the end of life of the battery is reached. It is calculated by dividing the length of the orthonormal $\|\vec{x}\|$ by the speed of convergence $\vec{v}$ along the orthonormal $\vec{x}$. The length of the orthonormal $\|\vec{x}\|$ may be interpreted as the distance to the end of life threshold as illustrated in FIG. 6. The direction of $\vec{x}$ may be parallel to the direction of a specific feature as illustrated in FIG. 2, or as illustrated in FIG. 6, it may progress in another direction. In that case, it may be assumed that battery degradation is captured by multiple features.

The thresholds may be initially estimated when the battery diagnosic/prognostic system is implemented. In order to monitor it's performance, metrics may be defined using the characteristics of batteries that are replaced during maintenance and vehicle break-down statistics. The thresholds may be adjusted adaptively if the metrics indicate that the system is not performing adequately.

Returning to FIG. 3, in some examples, the speed of convergence may be further updated based on the degradation or service history of the battery. For example, the speed of convergence may be further adjusted as a function of a time or duration elapsed since the battery was first installed or operated in the vehicle. As another example, the time or duration elapsed since the battery was last serviced, repaired, or reset may be taken into account. In addition, the service history may include details regarding a rate of degradation of the battery prior to the most recent service event, a base rate of degradation of the battery, an average rate of degradation of the battery over the life of the vehicle, and any diagnostic codes associated with the battery that were enabled over the life of the vehicle.

In still further examples, the speed of convergence may be further updated based on vehicle driving statistics. The vehicle driving statistics may include, for example, a distance covered over the life of the vehicle (e.g., based on an odometer reading), a number and frequency of service events that have occurred over the life of the vehicle (e.g., how many oil services have occurred, what frequency they were performed, what odometer reading they were performed at), average fuel economy of the vehicle, average speed of the vehicle, average transmission gear usage of the vehicle, average number of miles covered each day, average tire pressure of the vehicle, etc. The vehicle driving statistics may further include, for example, operator specific driving patterns and habits. For example, this may include an operator's preference for fuel economy versus performance, frequency and degree of pedal application and depression (e.g., whether the operator is "lead footed"), how aggressively the operator tends to drive, average speed at which the operator drives, etc. Vehicle driving statistics may further include details regarding weather conditions in which the vehicle is typically driven, such as whether the vehicle is typically operated in rain or snow, dry or humid conditions, etc. The vehicle driving characteristics may reflect driving tendencies of the operator and average conditions experienced by the vehicle battery which may affect the speed of convergence of one or more of the selected characteristics at different rates.

In the case of monitoring a propulsion battery in a hybridized or electric vehicle and predicting it's time to end of life, a future (e.g., predicted) driving pattern may be taken into account, such as the terrain, ambient altitude and temperature, predicted pedal events, and inclines/declines that are expected along a selected navigational route. For example, if the operator applies the accelerator and brake pedals frequently (or is expected to in view of the selected travel route), the battery may experience higher than average charge throughput. A battery would only drain in those conditions if it was used for propulsion in an electric vehicle. In other vehicle configurations, traffic predictions may be used to estimate charge throughput in all types of vehicles, and charge throughput may be directly correlated to battery deterioration and aging. As another example, if the operator drives aggressively, the battery may heat up faster, and wear due to higher average battery temperatures. Accordingly, the speed of convergence may be increased indicating that due to the vehicle driving statistics, the battery can be expected to degrade faster.

In one example implementation, the end of life prediction may be implemented in a vehicle with a display on the dashboard indicating the remaining battery life. Therein, the end of life thresholds and other calibration parameters may be flashed in the vehicle on the assembly line and may only be updated during irregular service visits, if at all. Feature data may come from the battery monitoring sensor and any battery monitoring algorithms or controller running in the vehicle's control module or another on-board ECU. The feature gradients describing the speed of convergence of a given feature to the corresponding threshold may be calculated online and stored in the body control module or another ECU.

In another implementation, the prediction algorithm may run externally with battery parameters transmitted from the vehicle to a cloud, or to an external device where the algorithm runs. The external device may include, for example, a handheld device such as a smart phone or tablet. Further, the algorithm may be configured as an application running on the device. If the algorithm runs in a cloud, battery parameters may be transmitted continuously or may be scheduled for transmission during regular intervals. Transmission may also be triggered by operational modes such as key-on, key-off or the initialization of service routines at a dealership. If the algorithm runs on an external device, transmission of data will occur when a wired or wireless link is established with the vehicle. This may occur at any time, but will usually occur when the vehicle is being serviced.

In some examples, instead of computing the EOL of the battery, a state of health (SOH) of the battery may be output, wherein the SOH of a battery can be expressed as a percent of remaining life that varies from 100% for new batteries to 0% for dead batteries. As the battery ages, its internal resistance increases, its internal capacity decreases, and correspondingly its SOH decreases.

At 318, the method includes converting the estimated EOL or SOH of the battery to an EOL estimate that can be easily understood by the vehicle operator, such as a remaining time of distance of vehicle operation remaining before complete battery degradation (when the battery dies). At 320, the remaining time or distance may be displayed to the vehicle operator. For example, the estimated time/distance remaining before degradation of the battery may be displayed to the vehicle operator on a display screen of a central console of the vehicle.

In one example, the controller may use an algorithm to convert the state of health into an estimate of time/distance remaining before degradation of the component occurs. For example, the controller may convert the predicted state of degradation into a remaining time or duration estimate for display to a vehicle operator based on past driving history data and predicted future driving, including the past history of the determined metric. In addition, the predicted state of degradation may be converted into a remaining number of fuel tank refilling events for display to the vehicle operator based on the past driving history data and predicted future driving.

For example, it may be displayed that "the battery will need to be replaced in 120 miles". This may provide the operator with a more comprehensible estimate of when the battery needs to be serviced. In addition, the displayed estimate may prompt the vehicle operator to adjust their driving pattern, for example, the operator may be prompted to drive less aggressively.

In some examples, determining the end of life using pattern recognition also enables the controller to determine if a battery belongs to a particular set of failed batteries given its features and their speed of convergence (or trends in their speed of convergence). This data may be used by a dealership or a fleet controller to schedule servicing for other batteries for other vehicles in the same fleet. Similarly, an individual vehicle owner could also use the provided information to plan a trip and appropriate repairs or service schedule. For example, the EOL prediction displayed to a vehicle operator may include "There is a 73% probability that the battery belongs in the set of failed batteries. The confidence level of this assignment is 95%."

Various communication strategies may be used to alert the driver and maintenance personnel to an imminent battery failure, the various strategies taking marketing, customer satisfaction, warranty costs, and other factors into account. Generally, the strategy may communicate directly with the maintenance personnel and with the driver on separate occasions when corresponding thresholds are passed. The communications may be triggered repeatedly during a count-down until the end of life is reached.

In further examples, such as where the vehicle is an autonomous vehicle, the controller may also limit or curtail autonomous functions of the vehicle based on the predicted EOL. For example, autonomous operation limitation may come into effect if the predicted EOL of the battery is predicted to be within a predefined amount of time.

In some examples, the various alerts, communications and control strategies, that send messages to the driver/maintenance personnel and curtail functionality, may be executed in a step-wise manner as the predicted end of life of the battery becomes shorter. As an example, vehicle drivers may be warned of an imminent battery failure and to expect loss of assist in the steering system or periodic shut-down of climate control or entertainment systems as corresponding EOL thresholds are reached. An example of the step-wise providing of notifications and the step-wise limiting of an autonomous vehicle's functionality is shown with reference to FIG. 9. At 322, after learning the performance characteristics, the EOL thresholds may be updated, as elaborated at FIGS. 7-8.

Figure 4:
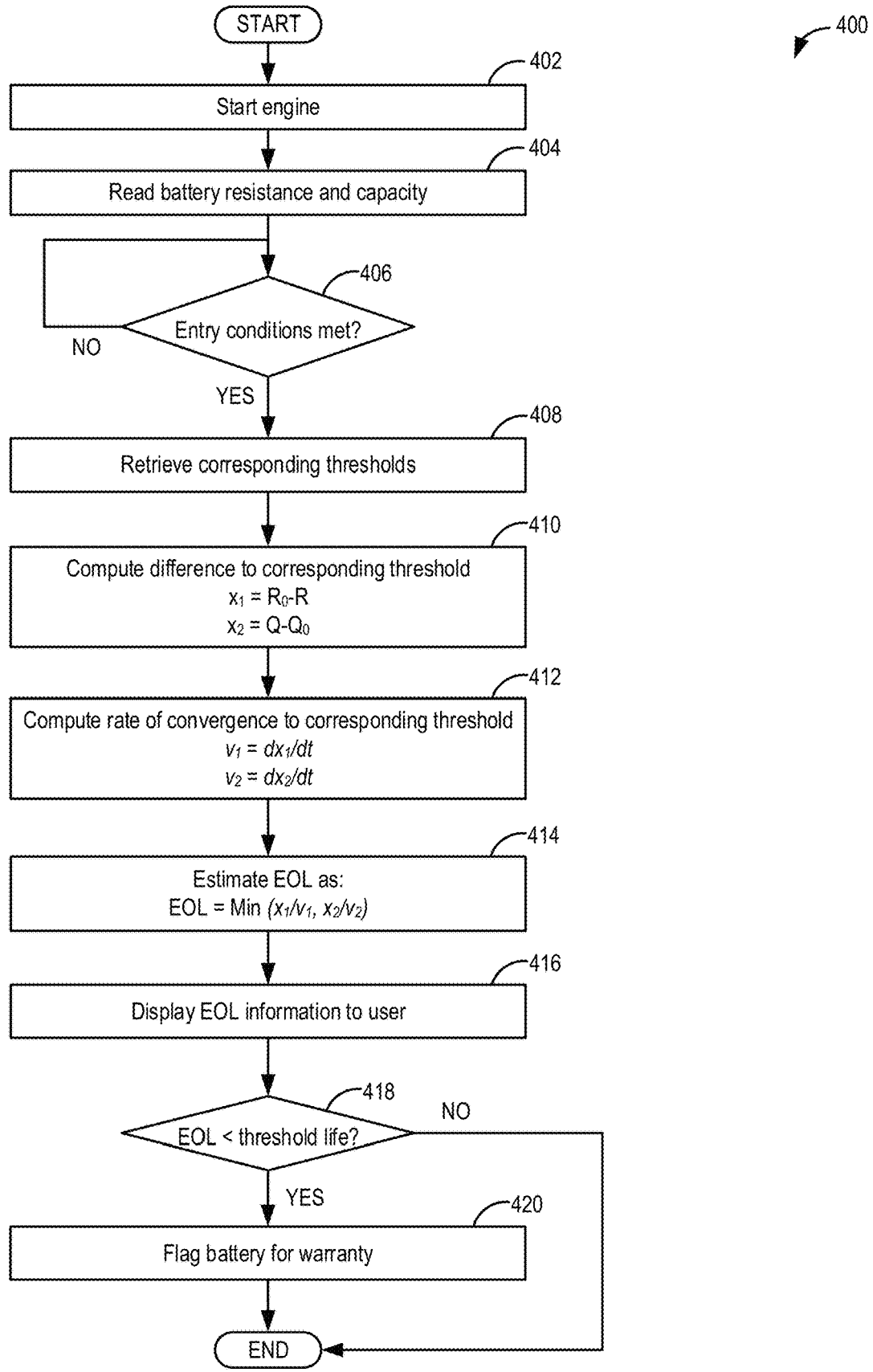
FIG. 4 shows a high level flow chart of an example method that may be used to predict the remaining life of a vehicle battery.

An example implementation of the method of FIG. 3 is shown at FIG. 4. Method 400 represents a base or minimal implementation with only two features being assessed.

At 402, an engine is started. At 404, battery resistance and capacity are read, such as based on the output of a battery voltage and current sensor. At 406, entry conditions for the diagnostic routine are confirmed. In one example, entry conditions are confirmed when there are no flags set associated with the battery resistance or capacity measurement. For example, it may be confirmed based on the flags and other diagnostic codes that the data provided by the voltage and current sensors is accurate and reliable. If entry conditions are not met, execution of the routine is delayed until conditions are met.

At 408, thresholds corresponding to the measured battery characteristics are retrieved, such as from a controller's memory, or via establishing communication to an external device or cloud where the thresholds are computed. At 410, a difference to the corresponding threshold is computed. For example, the distance of the resistance to the threshold is determined as $x_1 = R_0 - R$ and the distance of the capacity to the threshold is determined as $x2 = Q_0 - Q$.

At 412, a rate of convergence of each of the battery and the resistance to the corresponding thresholds is determined. At 414, a minimum of the two rates is selected and used for predicting the EOL. The determined EOL is then displayed to the user at 416. The user may be the vehicle operator, a fleet owner, dealership, etc. At 418, the EOL is compared to a threshold life. The threshold life is a non-zero calibratable threshold. In one example, the threshold life is set at 75% of the reserved capacity or is defined based upon the vehicle requirements that have to be fulfilled by the battery. If the determined EOL is less than the threshold life, then at 420, the battery is flagged for warranty. For example, a malfunction indicator light (MIL) may be illuminated asking the vehicle operator to take the battery to a service station or to the dealership for servicing.

It will be appreciated that the above-described approach may be used to predict the remaining life of a number of battery types in various implementation scenarios. For example, the method may be implemented for lead-acid starting-lighting and ignition (SLI) batteries in conventional, hybrid and electric vehicles, for propulsion batteries based on Li-Ion or other technologies in hybridized vehicles and electric vehicles, and for batteries of any type used in boats, aircraft or stationary power applications. Other scenarios may include running the battery health prediction algorithm on-board a vehicle, displaying battery health and end of life prediction on a vehicle dashboard, transmitting the health assessment and end of life prediction for readout on an external device (e.g., a hand-held device without a continuous data stream or otherwise), running the prediction algorithm externally, and transmitting the parameters to an external device with display or cloud where the algorithm runs.

In one example, a vehicle controller may define the generic battery in service metric as:

$$BISFM_f = \frac{F(f)}{N(f, G)},$$

where F(f) represents the number of batteries that failed in vehicles fulfilling the following conditions: (1) The failure mechanism(s) of the batteries is (are) associated with feature f; and (2) the value of feature f identifies a healthy battery at the end of life. N(f,G) represents the total number of batteries in the field that are monitored by the diagnostic/prognostic system with respect to feature f and fall within the group G. The group definition may define battery sizes and may also include vehicle types, electrical content (options) and other constraints. The performance metric is designed to measure and improve system performance for the vehicles or platforms defined by G. Once the EOL-thresholds are adjusted, the population of batteries in the field may be monitored over a sufficiently long time span for new failures to occur despite or with the updated thresholds. The monitoring period Tf is associated with a given feature and may be chosen analytically to guarantee a maximum possible variation of the metric over several monitoring periods or by other means.

A metric BISFMf may be used to define the percentage of battery failures that occur by mechanisms that are identifiable by feature f. High diagnostic/prognostic system performance may occur with a low-valued performance metric, and minimum acceptable performance may be defined by a threshold BISFThf. If the metric exceeds this threshold, it may be assumed that the EOF thresholds are not sensitive enough, and too many batteries are failing in vehicles without warning.

Accordingly a false replacement metric (FRM) is determined that measures the performance of the battery diagnostic/prognostic algorithm in avoiding excessive battery replacement due to false positives or over-sensitivity due to the calibration of the associated performance threshold. In one example, the generic false replacement metric (FRF) may be defined as:

$$FRM_f = \frac{I(f)}{N(f, G)},$$

where I(f) represents the number of batteries that fulfill the following conditions: (1) Battery identified as failed due to the value associated with feature f and the associated EOF-threshold; and (2) bench tests or laboratory investigations into the battery's state of health indicate that it is only discharged and that replacement was or is not necessary. N(f,G) maintains the same definition as above. It represents the total number of batteries in the field that are monitored by the diagnostic/prognostic system with respect to feature f and fall within the group G. A monitoring period Tf may be associated with a given feature and may be chosen analytically to guarantee a maximum possible variation of the metric over several monitoring periods or by other means. Hence, the calculated value of FRMf may only be used if the feature is monitored over a period Tf.

For the performance metrics defined above, unacceptable performance may occur when the metric exceeds its associated threshold. The EOL-thresholds may therefore be adapted to improve performance. If no system knowledge exists that maps a change in the EOL threshold to a change in performance, a small incremental change in the EOL-threshold ΔEOLThf may be applied. If the relation between a change in the EOL-threshold EOLThf and the generic performance $PM_f$ exists for a given feature f, it may be expressed as a transfer function of the form: $\Delta PM_f$=h ($\Delta EOLTh_f$). In case no transfer function is available, the application of an initial incremental change to the EOL-threshold may be used as the basis of creating a transfer function for future use. The process of estimating a necessary change in the EOL-threshold to obtain a desired change in the performance metric $\Delta PM_{f^*}$ may defined by the inverse function of the form: $\Delta EOLTh_f$=h($\Delta PM^*_f$). The use of a transfer function to adaptively update an EOL-threshold is referred to as a smart adaptation, and is elaborated with reference to the examples of FIG. 5 and the routine of FIG. 7.

Figure 7:
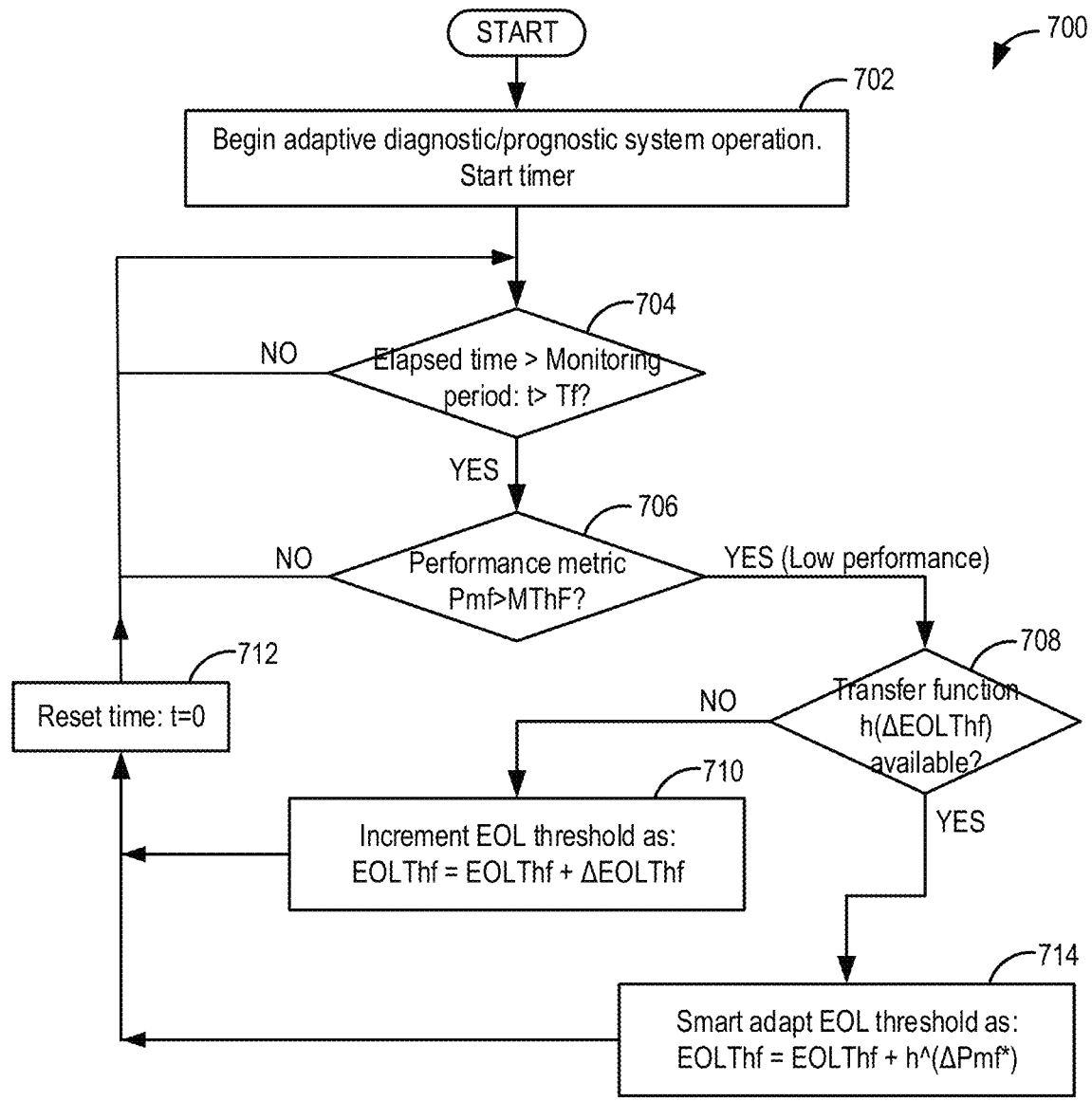
FIG. 7 shows a high level flow chart of an example method that may be used to update an EOL threshold based on vehicle performance metrics.

Turning now to FIG. 7, method 700 shows an example end of life adaptation process for a specific battery feature.

At 702, the method includes initiating the adaptive diagnostic/prognostic system operation including starting a timer. At 704, it may be determined if the elapsed time is greater than a defined monitoring period. For example, it may be confirmed that the population of vehicles with the battery system have been monitored for at least the defined monitoring period. In one example, the monitoring period is a duration over one year (and has a value of 12 months) in order to cover each of the seasons. If the defined period has not elapsed, then the method returns to monitoring the system and comparing the output of the timer to the defined monitoring period. In other words, the method enables the system performance metric to be updated only after the population of vehicles with the system are monitored for at least the designated monitoring period.

Upon confirming that the defined period has elapsed, at 706, the method includes comparing the performance metric of the system feature (e.g., the batteries in service metric BISFf or false replacement metric FRMf) to a corresponding threshold. The threshold applied here may be selected as a function of the features whose performance is being assessed. Thus a battery resistance threshold used for a battery performance metric may be distinct from a battery capacity threshold used for the battery performance metric. For the performance metric, unacceptable performance may occur when the metric exceeds its corresponding threshold. Therefore if satisfactory performance is identified, such as when the performance metric does not exceed the corresponding threshold, the method resumes the monitoring. Else, if satisfactory performance is not identified, such as when the performance metric does exceed the corresponding threshold, the method proceeds to update the EOL threshold. Specifically, at 708, it may be determined if a transfer function mapping incremental change in the EOL-threshold to the performance metric is available. If it is available, then at 714, the method includes using the available transfer function mapping to estimate the smart adaptation of the EOL-threshold. Else, at 710, a calibrated initial value is used. The sign of the adaptation of the EOL-threshold may depend on the specific feature and metric that is being monitored, and a change in the EOL-threshold for one feature may cause the need for changes to the threshold of a second feature. Examples cases are illustrated in reference to FIG. 5.

At FIG. 5, map 500 depicts a probability distribution function of measured internal resistance values of failed batteries (e.g., of a vehicle fleet, or at a dealership) and EOL thresholds. Herein, the initial choice of the EOL-threshold for the internal resistance of the battery may be too high or low, depending on the metrics under consideration. A first example of an initial EOL-threshold 502 with respect to the probability distribution of internal resistance values observed in a large sample of failed batteries is shown at map 500.

Water loss and corrosion are failure mechanisms that are correlated to high internal battery resistance. Assume that a diagnostic/prognostic system is in place that monitors normed internal battery resistance (RiTNom), and that it follows the process described in FIG. 7. Assume further that monitoring has occurred for at least the prescribed monitoring period TRiTNom. If the BISF-metric corresponding to water loss indicates that the percentage of vehicles in the field that have starting failures due to water loss is too high, the EOL failure threshold must be made smaller so that it includes a larger percentile of batteries are diagnosed as having degraded batteries. This is illustrated at map 510 as the adapted EOL threshold 504. By updating the EOL threshold, more failing batteries are brought to the attention of owners and service personal, so they could be exchanged before a vehicle becomes stranded.

In one example, the change in the EOL-threshold may be made using a transfer function that estimates the change in a performance metric with respect to the change in an EOL-threshold. If this is not available, the magnitude of the change may be estimated. For the example here, if the adaption of the EOL-threshold was not made using an accurate transfer function, the adaptation may be excessive or too little. This must be determined after the vehicles in the field are observed for at least another minimum monitoring period TRiTNom after the adaptation from initial EOL threshold 502 to updated EOL threshold 504. If the adaptation was excessive, it may be that too many vehicles are diagnosed with failing batteries. This would lead to excessive warranty costs and possible owner dissatisfaction due to the unnecessary work done on the vehicle. Misdiagnosis of healthy batteries would be flagged by the FRMf-metric exceeding its performance threshold. If this occurs, the EOL threshold may be adapted once again by slightly increasing the threshold as illustrated at map 520. Specifically, the updated threshold 504 may be further adjusted to updated threshold 506 wherein updated threshold 506 is closer to the initial threshold 502 than updated threshold 504. A magnitude of the second adaptation (that, the adaptation from threshold 504 to threshold 506) may use information from the first adaptation (that is, the adaptation from threshold 502 to threshold 504) to better ensure that it is not excessive and that the percentage of undiagnosed problems defined by the BISF-metric does not again become excessive. This is part of the smart adaptation algorithm described at FIG. 7. Changes in performance metrics with respect to EOL-thresholds may be logged and used for future adaptions. In one example, in the context of control theory, the adaptation may include a model predictive control algorithm with adaptive model parameters.

One example scenario where the battery EOL threshold may be updated includes a situation where battery water loss occurs. Battery water loss is a significant degradation mechanism for a group of batteries comprising a specific vehicle platform and battery size. If the number of undiagnosed problems, as reflected by the BISF-metric, is too high, the failure mechanism (water loss) may be dealt with directly by lowering the charge voltage set-point of the battery at high temperatures. This will lower the number of failures due to this mechanism, and the value of the performance index will sink proportionally. However, lowering the charge voltage may induce sulfation, which will effectively reduce the capacity of the battery over time. It may cause the batteries to fail due to a loss of capacity instead of an increase in internal resistance. Such failures would occur when the vehicle is parked and the battery is depleted unusually quickly due to the key-off load. This failure mechanism may be monitored by the battery feature "normed battery capacity" (QCapAhTNom). Lowering charge voltage would increase vehicle failures in a large population of vehicles due to sulfation to some degree. If the number of undiagnosed vehicle failures becomes excessive as a result of the change, the BISF-metric corresponding to battery capacity will exceed its performance threshold. Thus, the adaptation of a threshold for a first feature may affect the adaptation of a threshold for a second, different feature. Following the process illustrated in FIG. 7, the BISF-metric for battery capacity may only be updated after the population of vehicles outfitted with the diagnostic/prognostic system are monitored for at least the designated monitoring period after the change in set-point control occurs. After this monitoring period, the BISF-metric for battery capacity is compared with its corresponding threshold. If it is found to be excessive, the EOL-threshold for the feature "normed capacity" may be lowered as illustrated in map 1000 of FIG. 10, from initial EOL threshold 1002 to updated EOL threshold 1004 in a similar manner as the change in the EOL-threshold for internal resistance described with reference to FIG. 5. As in the case with water loss, several adaptations may be required to achieve acceptable performance with respect to all performance metrics, and new technology may be applied to mitigate the failure mechanisms associated with loss of battery capacity.

The performance of the diagnostic/prognostic system may also be affected by changes to the set of vehicles being monitored. Changes may be seen as noise factors and classified into several categories. These changes may cause the shape of the distribution functions of battery parameters to evolve, and EOL-thresholds may need to be adapted to maintain acceptable levels of performance. Technology changes that may affect performance include new battery charging strategies or changes to the packaging of the battery that affect operating temperature. Changes in this category may also include improvements in the battery design.

Changes in battery operation in a group of vehicles may also affect performance. Such changes include upgrades in electrical content of a vehicle (e.g., more entertainment devices operated in key-off conditions), or if the group of vehicles is sold in a new market with extreme ambient temperatures (e.g., in a new environment that is much cooler or much hotter). This may occur if vehicles designed for operation in a temperate market are sold in a land with very hot or cold average temperatures. System performance may also be affected if battery monitoring techniques change. New battery monitoring techniques for the basic features like internal resistance or capacity may cause the distribution of values of a given feature at EOL to change as well. Every vehicle and electrical system can be expected to be subject to these changes as they evolve. For this reason, system performance should be continuously monitored and refined using EOL-threshold adaptation. Performance thresholds should also be periodically reviewed in order adjust them with respect to the state of the art in diagnostic capability and warranty goals. They may be defined to drive the system to be as accurate as possible without causing excessive warranty costs.

Figure 8:
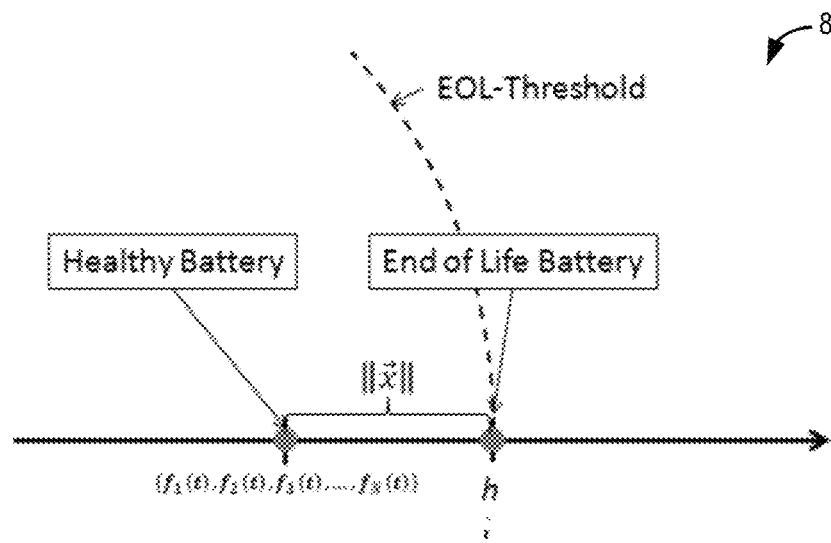
FIG. 8 shows example intermediate EOL thresholds that may be implemented during a battery end of life prediction.
Figure 8:
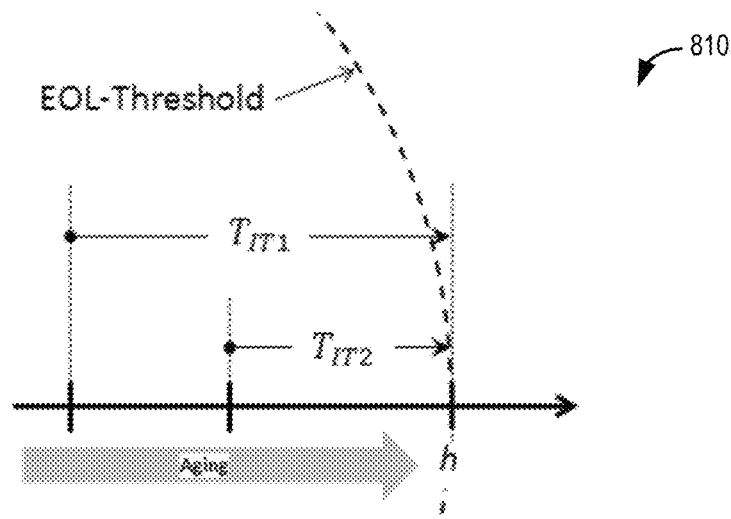
Figure 8:
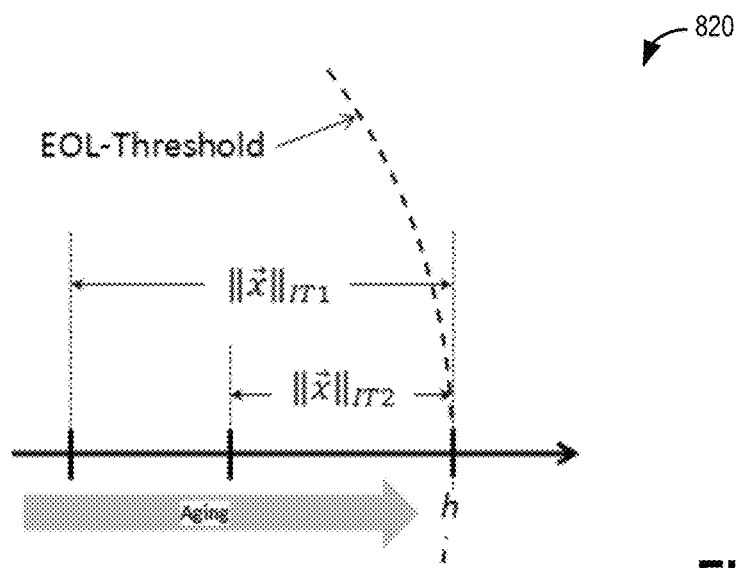

As discussed above, the EOL threshold may be determined by analyzing degraded or failed batteries, using aging models, or other approaches. The threshold may then be represented as a set of linear boundaries, such as those depicted at FIG. 2. Alternatively, the threshold may be represented by a curve or manifold, as illustrated at FIG. 8. In some examples, the controller may also define one or more intermediate thresholds, as discussed with reference to maps 800, 810, and 820 of FIG. 8.

In map 800, h represents the value of the EOL curve for a generic feature. One or more intermediate thresholds may be selected that define a predicted time until the end of life is reached. The intermediate thresholds may be introduced between the current state of the battery f(t) and the end-of-life threshold. The distance to the intermediate end-of-life threshold $\|\vec{x}\|_{IntThresh}$ depends on the convergence speed $\vec{v}$ and the chosen intermediate time threshold $T_{IntThresh}$ as defined by the relation:

$$\|\vec{x}\|_{IntThresh} = \frac{T_{IntThresh}}{\vec{v}}$$

Communication and control activities may be triggered when the state of the battery reaches predefined times before the predicted end of life or predefined distances to failure. In the case of thresholds defined in time, as shown at map 810 of FIG. 8, triggers may occur if the battery state is within a given number of hours, days or weeks of failing. For example, a first communication or control activity may be triggered when the battery feature is at a first intermediate threshold $T_{IT1}$ at a first duration from the predicted EOL (h). A second communication or control activity may be triggered when the battery feature is at a second intermediate threshold $T_{IT2}$ at a second duration from the predicted EOL (h), the second duration smaller than the first duration, and therefore closer to h.

In the case of thresholds defined by distance to failure, triggers may be defined to occur if certain battery features degrade. As an example, if battery internal resistance is a feature under surveillance, a trigger may be activated if the internal resistance comes within a calibrated distance to the internal resistance corresponding to end of life, as illustrated at map 820 of FIG. 8. Therein threshold $\|\vec{x}\|IT1$ defines a first intermediate internal resistance threshold, $\|\vec{x}\|IT2$ defines a second intermediate internal resistance threshold, and h represents the threshold at the predicted end of life. A first communication or control activity may be triggered when the battery feature is at the first intermediate threshold while a second communication or control activity may be triggered when the battery feature is at the second intermediate threshold, the second threshold closer to h than the first threshold.

The distance to failure may be defined by multiple features. If battery capacity is a second feature under surveillance, a trigger may occur depending on both internal resistance and capacity. A trigger may occur if battery resistance or battery capacity loss exceeds separate thresholds, or if battery resistance and battery capacity loss exceed separate thresholds, or if the values of battery resistance and capacity in "feature space" come within a predefined distance to the end of life threshold as illustrated in FIG. 6. In this way, the end of life threshold in feature-space may be augmented by intermediate thresholds that represent specific times until end of life is reached or distances to end of life. As such, the distances to end of life may be interpreted as distances to failure of the component.

When an intermediate threshold approaching the end of life representing a distance or time to failure is passed, a communication strategy may be triggered. Communication may be directed to the driver, and to entities such as the vehicle manufacturer. Additionally, communication may be directed to a local car dealership or fleet owner if a radio data link (e.g., modem) is implemented for communication with the outside world. In addition to the communication, one or more actions may be recommended in view of the imminent EOL of the battery.

Because the 12V accessory battery in the autonomous vehicle supports safety critical systems in some modes of operation, autonomous functions may be disabled if a defective battery or a battery nearing its end of life is identified. Disabling autonomous functions abruptly may cause customer dissatisfaction and inconvenience, especially if the vehicle cannot be driven manually. Therefore it is imperative to warn the driver and service personnel of an imminent battery failure before it occurs so that the battery could be replaced. For this reason, predicting the time until the battery reaches its end of life has a special importance in autonomous vehicles.

On top of customer satisfaction issues, it has been suggested that autonomous functions may be disabled or curtailed if the end of life of the battery is eminent but has not yet been reached. In this case limitations would come into effect if the EOL of the battery is predicted to be within a predefined of time.

Accordingly, a communication strategy may be used to alert the driver and maintenance personnel to an eminent battery failure while taking marketing, customer satisfaction, warranty costs and other facets into account. Generically, the strategy may communicate directly with the maintenance personnel and with the driver in separate occasions when corresponding thresholds are passed. The communications may represent a kind of count-down until the end of life is reached. Similarly, autonomous functions may be limited in a step-wise fashion as the end of life of the battery is approached. Each time a threshold is passed, the limitations may be stepped up until the vehicle is no longer allowed to drive itself, and manual driving may also be curtailed.

These types of communication and control strategies that send messages to the driver and maintenance personnel and curtail functionality in a step-wise manner as the predicted end-of-life of the battery may be applied to conventional vehicles as well. Drivers may be warned of an imminent battery and to expect loss of assist in the steering system or periodic shut-down of climate control or entertainment systems. Both of these types of events are symptoms of a failing 12V accessory battery.

Figure 13:
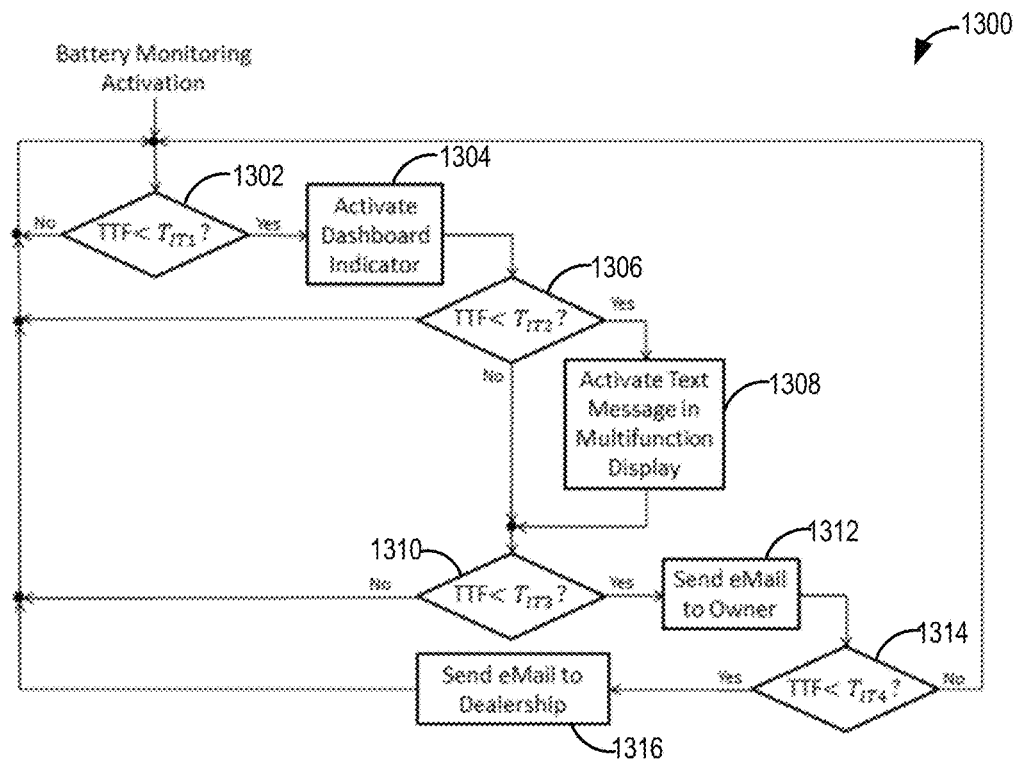
FIG. 13 shows an example communication strategy for a failing battery.

When an intermediate threshold approaching the end of life representing a distance or time to failure is passed, a communication strategy, such as the example communication strategy of method 1300 of FIG. 13 may be triggered. Communication may be directed to the driver, and to entities such as the vehicle manufacturer or car if a radio data link is implemented for communication with the outside world. In addition, communication may take the form of flags written into non-volatile memory in the vehicle that indicate when thresholds have been passed. Such flags may be read by service personnel in order to facilitate testing and replacement of the battery.

Communication to the driver himself may take the form of a warning light or text on the dashboard, an email or SMS sent to the driver's account, or a notice sent to an app on a driver's mobile device. The communication strategy may trigger new or different communication means to the driver or outside world as the thresholds coming closer to the predicted end if life are passed. For example, if the time to failure is estimated to be within three months, an indicator on the dashboard may be activated. If the battery is not changed and a time to failure within less than two months is predicted, a text message may appear on the dashboard when the vehicle is started. Passing subsequent thresholds may trigger emails to the driver and an alert to the dealership.

In FIG. 13, TTF represents the estimated time to failure (time to end of life), and $T_{IT1} \ldots T_{IT4}$ represent intermediate thresholds expressed in time. The communication strategy may be activated whenever the vehicle is driving or periodically when the vehicle is parked. When a first intermediate threshold is passed at 1302, an indicator on the dashboard may be activated at 1302. When a second intermediate threshold is passed at 1306, a text message may appear on the dashboard or an alternate multifunction display when the vehicle is started at 1308. When a third intermediate threshold is passed at 1310, the controller may send an email to alert the driver at 1312. When a fourth intermediate threshold is passed at 1314, the controller may send an alert to the dealership. It will be appreciated that the communication actions written in the blocks of FIG. 13 may include additional complex tasks that are not described in FIG. 13. For example the actions "Send eMail to Owner" or "Send eMail to Dealership" may include further logic to only enable an email to be set once a day.

Figure 14:
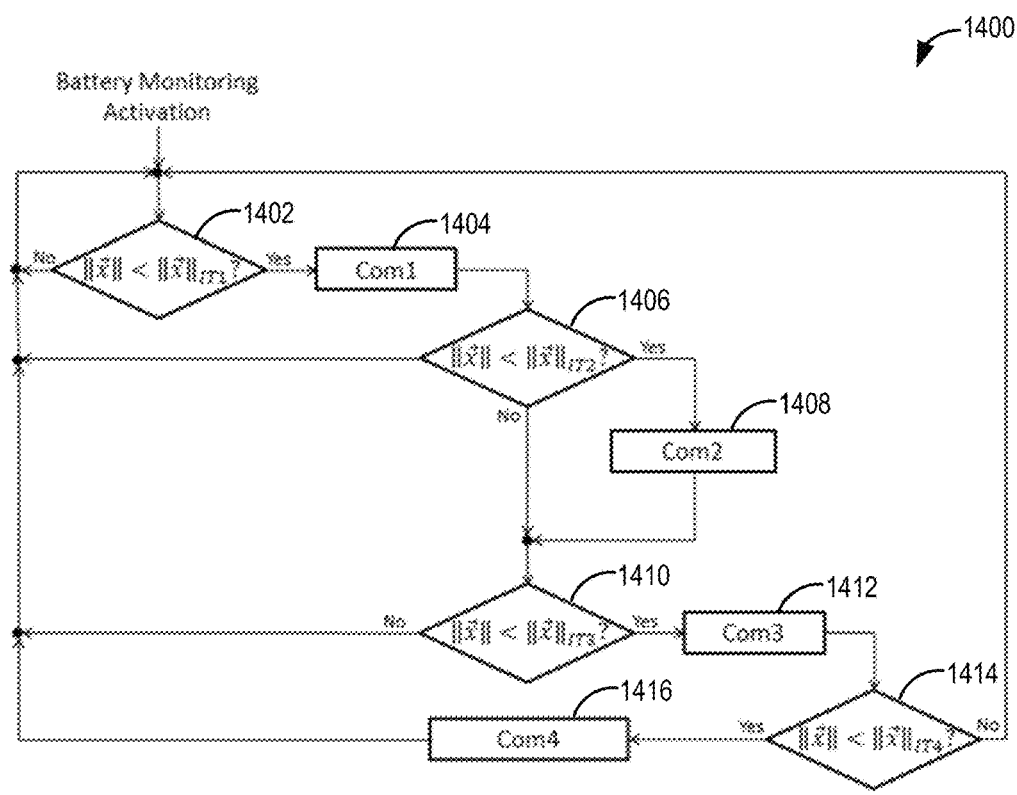
FIG. 14 shows a generic communication strategy for a failing battery.

Alternatively, the controller may use a generic communication strategy, such as illustrated at method 1400 of FIG. 14. Therein, the thresholds $\|\vec{x}\|_{ITx}$ are expressed with respect to distance to failure. Thresholds that are defined with respect to time may be redefined with respect to distance to failure using the equation:

$$\|\vec{x}\|_{IntThresh} = \frac{T_{IntThresh}}{\vec{v}}$$

Doing so allows the definition of communication strategies that are defined by both time to failure and distance to failure. For example, a strategy may trigger communication when the time to failure is less than a threshold or the internal resistance rises to a defined level.

The communication strategy of FIG. 14 may be activated whenever the vehicle is driving or periodically when the vehicle is parked. When a first intermediate threshold is passed at 1402, a first communication Com1 is transmitted at 1402. When a second intermediate threshold is passed at 1406, a second communication Com2 is transmitted at 1408. When a third intermediate threshold is passed at 1410, a third communication Com3 is transmitted at 1412. When a fourth intermediate threshold is passed at 1414, a fourth communication Com4 is transmitted at 1416.

The communication actions in FIG. 14 are generically designated as Com1 . . . Com4. As in the strategy illustrated in FIG. 13, the individual communication actions may be complex and have internal controls to modify or delay their transmission depending on external factors. For example, they may only communicate once a day or at vehicle key-off.

It will be appreciated that communication may take various forms including those described above as well as others.

In a similar fashion to communication strategies, different control strategies may be activated when intermediate thresholds representing a distance or time to failure are passed. As examples, a set of control strategies may be put in place to limit the autonomous operation of a vehicle or to limit or deactivate individual systems or functions in a vehicle with active suspension as a function of the passed intermediate thresholds. As an example, if a vehicle operates autonomously, steering, braking and powertrain control functions can be realized by electrical actuators. These may be servos that steer the vehicle (as with steer by wire systems) and electrical pumps and valves that actuate the brakes. Beyond actuation, control is done by a microprocessor that also relies on electrical power for operation. Electrical actuators are usually characterized by high current transients when they are switched on or when they are controlled to exert high forces. The primary electrical power supplies of modern vehicles may be alternators or generators when an internal combustion engine is used for propulsion or a high-voltage battery and DC-DC converter when the vehicle has an electric propulsion system. In either case, alternators, generators or DC-DC converters are usually not capable of supplying the transients drawn by active chassis systems. For that reason, 12V SLI batteries are implemented in parallel with the (low-voltage) power distribution network in order to provide electrical power when the primary power source is saturated.

When these batteries degrade and are no longer able to source sufficient power upon demand, actuation may be limited or not occur at all. This means that steering and braking may occur slowly and or not achieve desired actuation levels. While actuation is occurring with degraded batteries, the voltage on the power distribution network may decrease to significant levels, which may deactivate or reset the microprocessors that control the vehicle and not allow other actuators to operate properly. The degradation of actuation and critical voltage levels on the power distribution network may cause the vehicle to leave its desired path and cause a safety hazard. For that reason, 12V SLI batteries may be classified as safety-critical components in autonomous vehicles. Control strategies may be put in place to limit autonomous functionality if the time before the predicted end of life of the battery or the distance to failure becomes smaller than defined thresholds.

In one example, 6 levels of vehicle automation may be defined (e.g., numbered 0 through 5). For example, the Society of Automotive Engineers (SAE) has defined 6 levels of vehicle automation that are numbered 0 through 5. As the levels increase, the vehicle becomes more automated. In level 3 (half-way point), the vehicle may be controlled autonomously without human intervention, but it is required that the driver is always prepared to take control of the vehicle in case of problems or in case the limits of the control system is exceeded. In level 4, complete autonomy is possible in certain driving modes. In these modes it is not necessary that a driver be ready to perform control operations at all times. Level 5 is the highest level, and in this level no human intervention is required in any phase of vehicle operation. If the battery time or distance to failure falls below calibrated thresholds, autonomous functionality may be limited along the lines of the levels of vehicle automation as defined above. In other words, a vehicle that is capable of level 4 or 5 operation may be limited to level 3 if the time or distance to failure falls between a calibrated amount. Under such a policy, only functionality with driver supervision would be allowed. This would be communicated to the driver and possibly require his acknowledgement before a drive begins. If a control strategy is defined along these lines, operation of an autonomous vehicle may be limited to level 3 if the battery time or distance to failure falls below a calibrated intermediate threshold. If the time or distance to failure falls below a second intermediate threshold that is closer to the EOL-prediction, functionality may be limited to lower levels of functionality.

One example control strategy is illustrated with reference to method 1500 of FIG. 15. Therein, the controller may use thresholds that activate control modes expressed with respect to predicted time to failure. As in the case with communication strategies (FIG. 13-14), the thresholds may also be defined with respect to distance to failure, as well as mixed strategies using both types of thresholds. In the case of a control strategy that limits autonomous vehicle functionality, it may be expected that limitations in functionality may only be applied at the beginning of a drive when the driver has an opportunity to see and acknowledge them. Therefore in one example, the strategy illustrated in FIG. 15 may be activated when the vehicle is keyed on. The control strategy of FIG. 15 that limits a vehicle's autonomous functionality may be coordinated with the communication strategy of FIG. 13 or 14 to explain the cause of the limitation to the driver and communicate this and additional pertinent information to the dealership's service personnel.

Figure 15:
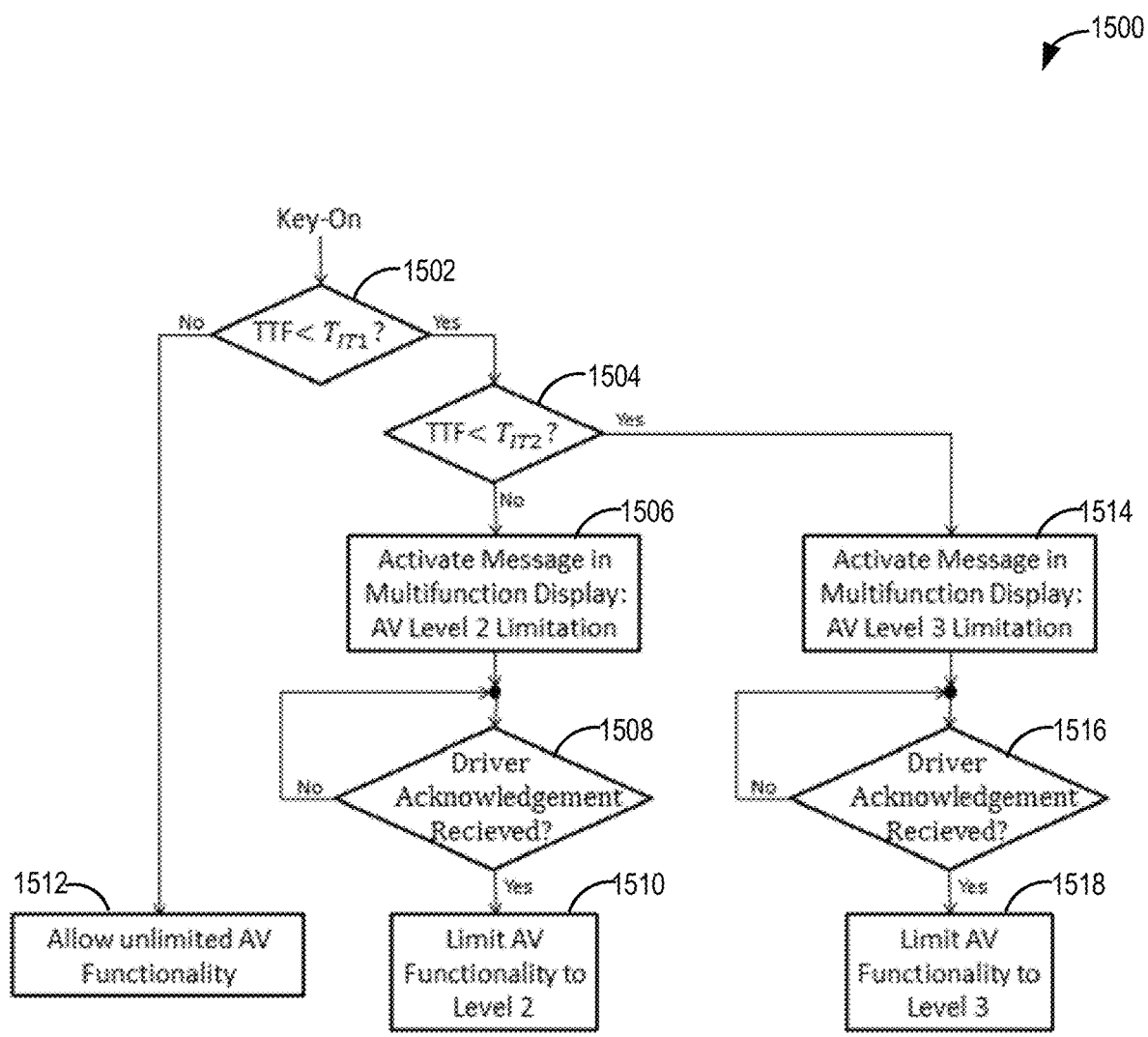
FIG. 15 shows an example mode limitation control strategy for autonomous vehicles.

The control strategy of FIG. 15 may be activated whenever the vehicle is keyed-on. When a first intermediate threshold is not passed at 1502, the controller may allow unlimited AV functionality for the autonomous vehicle at 1512. If the first intermediate threshold is passed but a second intermediate threshold is not passed at 1504, then the method moves to 1506 where the controller activates a message in the multifunction display (e.g., on the dashboard) indicating AV level 2 limitation being applied. If driver acknowledgement is not received at 1508 after activating the message, then the method returns to 1506 to continue displaying the message. Else, after receiving driver acknowledgement, at 1510, AV functionality is limited to level 2 (of the 0-5 levels defined by the SAE).

If the first and the second intermediate thresholds are both passed at 1502 and 1504, then the method moves to 1514 where the controller activates a message in the multifunction display (e.g., on the dashboard) indicating AV level 3 limitation being applied. If driver acknowledgement is not received at 1516 after activating the message, then the method returns to 1514 to continue displaying the message. Else, after receiving driver acknowledgement, at 1516, AV functionality is limited to level 3 (of the 0-5 levels defined by the SAE).

As described above, active chassis components that exert high mechanical forces in chassis systems may draw large power transients when they are activated, or when their output force is controlled to step up quickly. Examples of active chassis components include electrically-assisted power steering (EPAS), electric brakes and electrically-activated anti-roll control (eARC). The functional limitation of some non-essential active chassis systems may be carried out on conventional or autonomous vehicles in order to maintain functionality of those that are essential for safety. If these components are supplied by the 12V power distribution network, they may produce large voltage dips when they are activated unless the network is supported by a well-charged SLI battery. If the battery is at the end of its life, high internal resistance and diminished capacity along with internal short circuits and other age-related failure mechanisms may limit its ability to support these loads. Non-essential active chassis systems may be deactivated in order to favor functionality of systems that are deemed more critical for safety. In a vehicle with EPAS, electric brakes and electric roll control, the roll control may be deactivated if the time or distance to the battery's end of life is smaller than a threshold.

Figure 16:
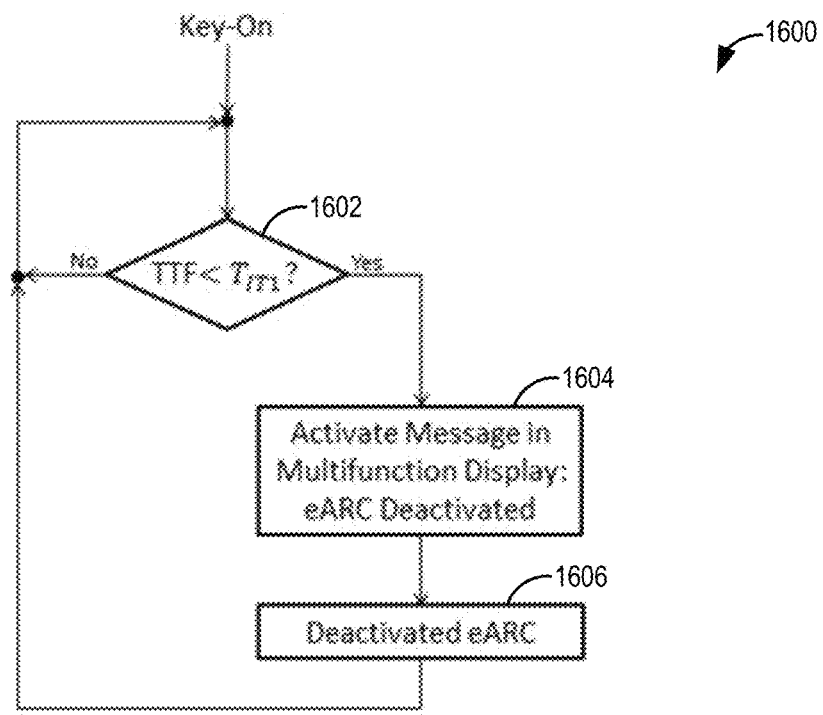
FIG. 16 shows a control strategy for limiting an electrically actuated anti-roll control function of a vehicle using EOL-criteria of a battery.

An example of such a control strategy is shown at method 1600 of FIG. 16. As in the case with communication and control strategies for autonomous vehicles, the thresholds may also be defined with respect to distance to failure $\|\vec{x}\|$, and mixed strategies using both types of thresholds may be used. The strategy illustrated in FIG. 16 is a specific implementation of a generic control strategy that may limit or deactivate any non-essential high-power load if the battery reaches its end of life.

The control strategy of FIG. 16 may be activated whenever the vehicle is keyed-on. When a first intermediate threshold is not passed at 1602, all settings are maintained. If the first intermediate threshold is passed at 1604, the controller activates a message in the multifunction display (e.g., on the dashboard) indicating that the electrically-activated anti-roll control eARC is about to be deactivated. At 1606, after activating the message, the eARC is deactivated. In this way, as intermediate thresholds are passed, non-essential vehicle systems may be deactivated in order to favor functionality of systems that are deemed more essential (e.g., critical for safety). Another type of control action that may occur at a battery's end of life is to increase the charge voltage to help maintain a high state of charge in the limited capacity that remains. Such a control strategy is illustrated in at method 1100 of FIG. 11. Method 1100 starts at 1102 by confirming a key-on event. If a key-on event is not confirmed, the method ends. At 1104, it is determined if an intermediate threshold time or duration has elapsed. In the depicted example, it is determined if threshold duration $T_{IT2}$ has elapsed. If not, the battery charge voltage is defined by function Z1 having a lower voltage. Else, if the threshold duration has elapsed, the battery charge voltage is defined by function Z2 having a higher voltage. Herein, Z1 and Z2 represent temperature-dependent charge-voltage curves. In this example, the voltages defined by Z2 would be higher than the voltages defined by Z1 to facilitate charging the battery.

Figure 9:
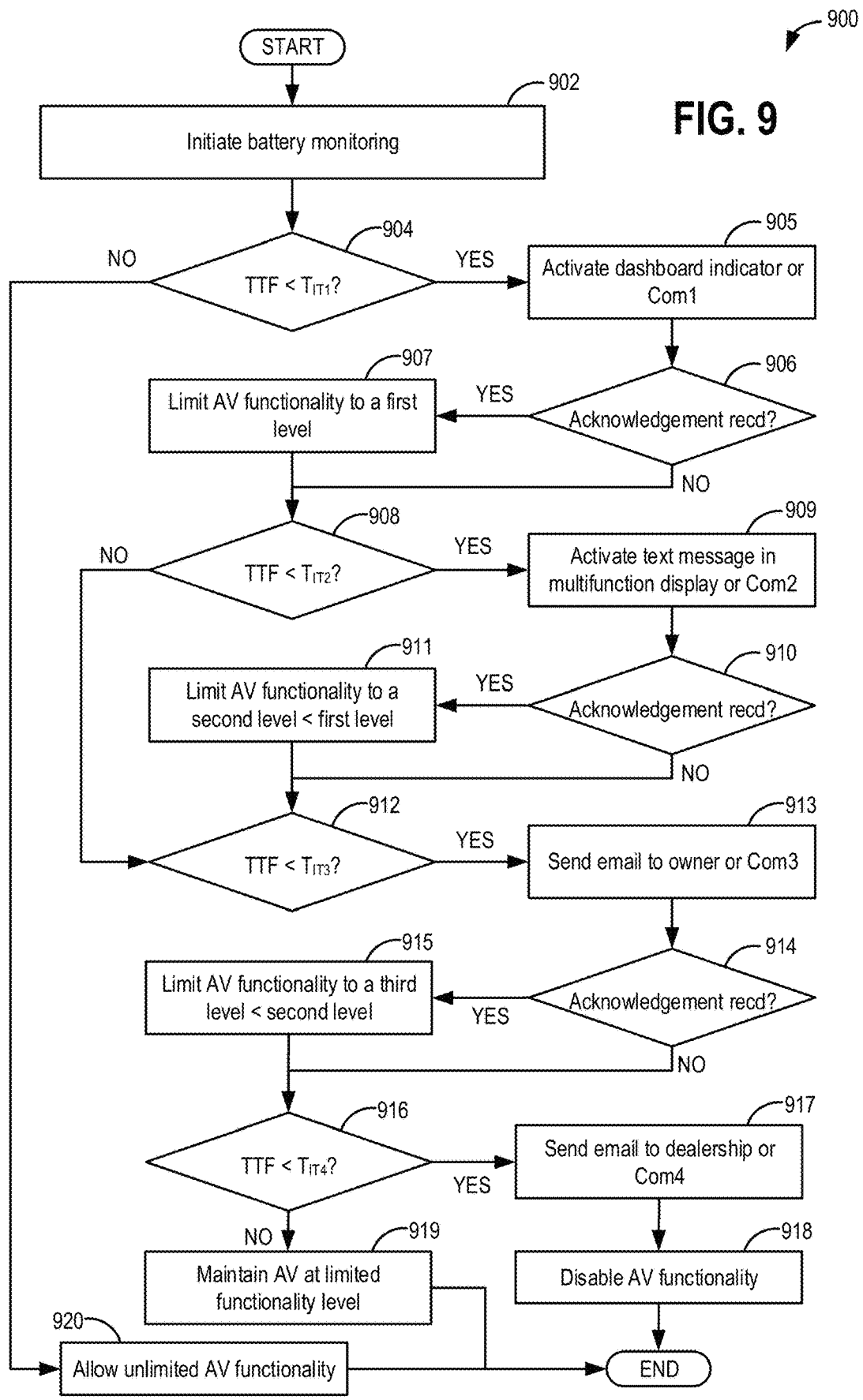
FIG. 9 shows a high level flow chart of an example method that may be used to update provide notifications to a vehicle operator and limit autonomous vehicle functions as intermediate EOL thresholds are crossed.
Figure 11:
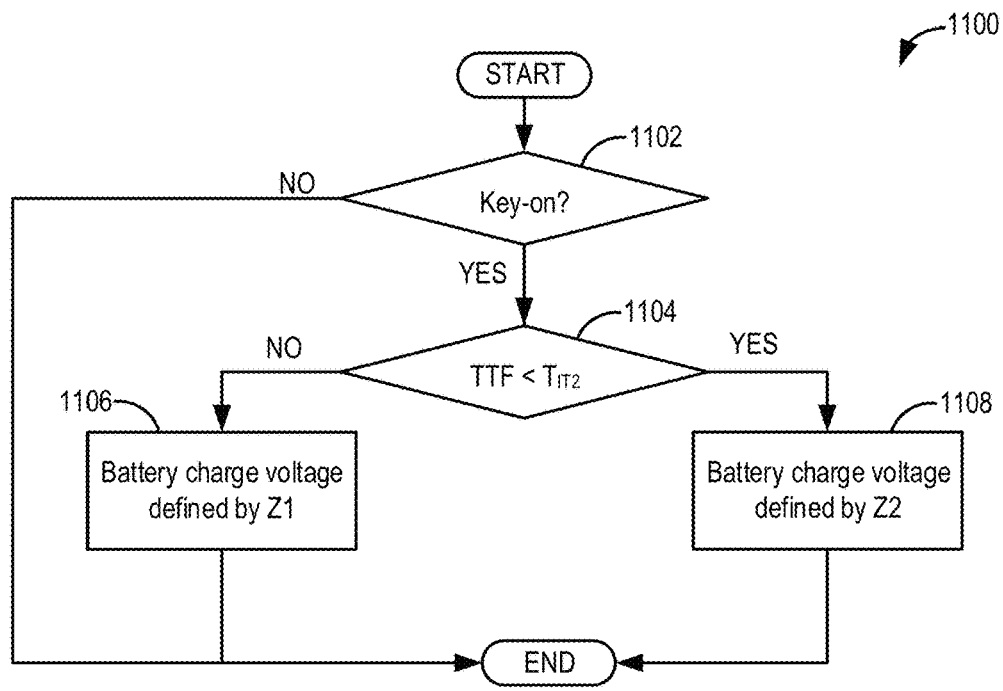
FIG. 11 shows a high level flow chart of an example method that may be used to update a battery charge voltage responsive to an intermediate EOL threshold being crossed.

While FIGS. 13-16 depict distinct communication and control action strategies, in still other examples, the communication and control action strategies may be combined, such as in the example strategy of FIG. 9. As with the independent control and communication strategies, method 900 of FIG. 9 uses intermediate thresholds. Therein TTF represents the estimated time to failure (time to end of life), and $T_{IT1}$-$T_{IT4}$ represent intermediate thresholds expressed in time. The communication strategy may be activated whenever the vehicle is driving or periodically when the vehicle is parked. While the intermediate thresholds $T_{IT1}$-$T_{IT4}$ are depicted at method 900 as time thresholds, it will be appreciated that in alternative examples, intermediate distance thresholds $\|\vec{x}\|$IT1-IT4 may be similarly applied without departing from the scope of the invention. In the depicted example, the method is for battery monitoring for an autonomous vehicle (AV) configured with autonomous driving capabilities.

At 902, the method includes initiating battery monitoring. At 904, the method includes if a first intermediate threshold (e.g., first time or distance threshold) has been reached. If the first threshold has not been reached, at 920, vehicle operation may continue without undertaking any limiting actions. For example, unlimited functionality of the autonomous vehicle may be allowed.

If the first intermediate threshold has been reached, then at 905, the method includes performing a first communication action (generically represented as Com1) such as by activating a dashboard indicator. For example, the first communication to the driver may take the form of a warning light or text on the dashboard. Optionally, at 906, it may be determined if an acknowledgement has been received, such as may be confirmed when the vehicle operator actuates a button or interacts with a touch display on the vehicle's dashboard. Upon confirmation, at 907, a first action may be undertaken. Else, the method may move to 908 directly. The first action may include, for example, the autonomous functionality of the vehicle being limited by a first amount to a first level, lower than the full autonomous functionality level. Limiting the autonomous functionality to the first level may include, for example, limiting autonomous functionality to the "Conditional Automation" corresponding to level 3 of the levels of vehicle automation published by the Society of Automotive Engineers (SAE Standard J3016 from Sep. 22, 2016). Alternatively, one or more non-essential functions of the vehicle (such as eARC for roll control) may be disabled.

The method then moves to 908 to determine if a second intermediate threshold (e.g., second time or distance threshold) has been reached, the second threshold closer to the EOL threshold (h) of the component than the first threshold. In other examples, the method may move from 905 to 908 directly and the limiting of the autonomous functionality to the first level may be included with the first communication to the driver at 905.

If the second intermediate threshold has been reached, then at 909, the method includes performing a second communication action (generically represented as Com2) such as by displaying a text message in a multi-function display of the vehicle. For example, the second communication to the driver may take the form of text displayed on the dashboard, an SMS sent to the driver's account, or a notice sent to an application running on a driver's mobile device. Optionally, at 910, it may be determined if an acknowledgement has been received. Upon confirmation, at 911, a second action may be undertaken. Else, the method may move to 912 directly. The second action may include, for example, the autonomous functionality of the vehicle being limited by a second amount, larger than the first amount, to a second level, lower than the first level. Limiting the autonomous functionality to the second level may include, for example limiting autonomous functionality to the "Partial Automation" corresponding to level 2 of the levels of vehicle automation published by the Society of Automotive Engineers. Alternatively, one or more additional non-essential functions of the vehicle may be disabled. The method then moves to 912 to determine if a third intermediate threshold (e.g., third time or distance threshold) has been reached, the third threshold closer to the EOL threshold (h) of the component than the first or second threshold. In other examples, the method may move from 909 to 912 directly and the limiting of the autonomous functionality to the second level may be included with the second communication to the driver at 909.

If the third intermediate threshold has been reached, then at 913, the method includes performing a third communication action (generically represented as Com3) such as by sending an email to the driver's account or to an application running on the driver's mobile device. Optionally, at 914, it may be determined if an acknowledgement has been received. Upon confirmation, at 915, a third action may be undertaken. Else, the method may move to 916 directly. The third action may include, for example, the autonomous functionality of the vehicle being limited by a third amount, larger than the second amount, to a third level, lower than the second level. Limiting the autonomous functionality to the third level may include, for example, all autonomous functionality may be disabled and the vehicle may only be manually driven if that is possible. Alternatively, all non-essential functions of the vehicle may be disabled.

The method then moves to 916 to determine if a fourth intermediate threshold (e.g., fourth time or distance threshold) has been reached, the fourth threshold closer to the EOL threshold (h) of the component than any of the first, second, or third threshold. In other examples, the method may move from 913 to 916 directly and the limiting of the autonomous functionality to the third level may be included with the second communication to the driver at 913.

If the fourth intermediate threshold has been reached, then at 917, the method includes performing a fourth communication action (generically represented as Com4) such as by sending an email to the dealership. In addition, at 918, a fourth, final action may be undertaken. The fourth action may include, for example, disabling the vehicle completely. Else, at 918, the method may include continuing to operate the vehicle with the limited autonomous functionality. While the method depicts four intermediate thresholds, in other examples, a smaller or larger number of intermediate thresholds may be included.

In this way, a controller may predict the time to end of life for vehicle batteries, such as lead-acid 12V SLI batteries that are commonly used in vehicles for starting, running accessories when the motor is not running, and support high-power load transients. Any of the methods and strategies discussed herein may apply to autonomous vehicles, as well as conventional gasoline or hybrid electric vehicles. Generic forms of the control and communication strategies described here may be applied to any vehicle that uses an SLI battery. In general these strategies trigger communication and control actions when the predicted time to end of life is smaller than a calibrated threshold. The nature of the communication and control actions may change as the predicted time to end of life decreases. Progressively increasing warnings as the end of life approaches through dashboard messages and emails may be applied to any vehicle. The same may be said for the control strategies. For example, as the end of life approaches, the charge voltage may be increased in steps, and the battery charging strategy may be modified to prolong the ability of the battery to provide basic functionality. The methods used herein to predict the end of life of SLI batteries may also be applied to traction batteries or other batteries as well. This may require the choice of new battery features to characterize the end of life condition. Any method that predicts the time to the end of life of a component may be used in conjunction with the generic control and communication strategies described here.

It will be further appreciated that while the methods disclosed herein predict the life expectancy of a vehicle battery, the methods may be similarly used to predict the life expectancy of a number of components in a road vehicle, such as tires, filters and lubricants.

In this way, a prognostics-based approach for assessing the remaining useful life of a vehicle battery is provided. The prognostics approach may be used to complement any existing prognostics feature by estimating the time left and/or the distance left before the battery degrades. By defining thresholds for each battery characteristic that affects battery life based on changes in its internal properties (such as resistance and capacity), a diagnosis of the present state of the battery and a prognosis of its health in the future including an estimate of the time to a battery end of life may be achieved. By relying on the estimated speed of convergence of a sensed battery characteristic to the corresponding threshold, the differing effects of different mechanisms of battery degradation (such as corrosion versus sulfation) can be accounted for. In addition, the trajectory of each characteristic can be used to better estimate the end of life of the battery. By more accurately estimating the remaining life of the component may providing it to the vehicle operator as a more comprehensible metric, warranty issues are reduced, and customer satisfaction is improved.

In one example, a method for a vehicle comprises: predicting a state of degradation of a vehicle battery based on a rate of convergence of a plurality of battery metrics, derived from sensed vehicle operating parameters, towards corresponding thresholds, the thresholds determined based on past driving history data including the past history of each of the plurality of battery metrics; and converting the predicted state of degradation into a remaining time or duration before battery end of life for display to a vehicle operator. In the preceding example, additionally or optionally, the plurality of battery metrics include a battery resistance and a battery capacity, and the sensed vehicle operating parameters includes one or more of a battery current, a battery voltage, and a battery terminal temperature. In any or all of the preceding examples, additionally or optionally, the predicting includes predicting a higher state of degradation as the rate of convergence of any one of the plurality of battery metrics increases. In any or all of the preceding examples, additionally or optionally, the method further comprises updating the corresponding thresholds based on vehicle performance following the converting. In any or all of the preceding examples, additionally or optionally, the method further comprises: comparing the predicted state of degradation to an end of life threshold and one or more intermediate thresholds in between a current state of degradation and the end of the life threshold; and limiting one or more vehicle functions based on the comparing. In any or all of the preceding examples, additionally or optionally, the vehicle is an autonomous vehicle and wherein the limiting includes: when the predicted state of degradation is lower than each of the one or more intermediate thresholds and the end of life threshold, operating the vehicle without limiting any autonomous vehicle functionality; when the predicted state of degradation is higher than a first of the one or more intermediate thresholds, operating the vehicle with a first degree of limiting of autonomous vehicle functionality; when the predicted state of degradation is higher than a second of the one or more intermediate thresholds, larger than the first of the one or more intermediate thresholds, operating the vehicle with a second degree of limiting of autonomous vehicle functionality, higher than the first degree; and when the predicted state of degradation is higher than each of the one or more intermediate thresholds and the end of life threshold, operating the vehicle without all autonomous vehicle functionality limited. In any or all of the preceding examples, additionally or optionally, the sensed vehicle operating parameter is sensed during transient and steady-state vehicle operating conditions, and the parameter sensed during transient operating conditions is weighted different from the parameter sensed during steady-state operating conditions. In any or all of the preceding examples, additionally or optionally, the method further comprises estimating a value of the determined metric as a function of a most recent estimate of the determined metric retrieved from the past history of the determined metric, and a distance traveled by the vehicle since the most recent estimate of the determined metric. In any or all of the preceding examples, additionally or optionally, the method further comprises, estimating a value of the determined metric as a function of an initial estimate of the determined metric, retrieved from the past history of the determined metric at a time of installation of the component in the vehicle. In any or all of the preceding examples, additionally or optionally, the method further comprises converting the predicted state of degradation into a remaining number of engine start events for display to the vehicle operator based on the past driving history data and predicted future driving. In any or all of the preceding examples, additionally or optionally, the thresholds are determined off-board the vehicle while the rate of convergence is determined onboard the vehicle. In any or all of the preceding examples, additionally or optionally, the vehicle is one of a plurality of vehicles of a fleet, the method further comprising: estimating the plurality of battery metrics for each vehicle of the fleet over at least a threshold duration; and predicting the state of degradation of the vehicle battery responsive to the estimating. In any or all of the preceding examples, additionally or optionally, the method further comprises, updating each of the end of life threshold and the one or more intermediate thresholds of the vehicle responsive to performance of each vehicle of the fleet following the predicting.

Another example method for predicting battery health for a vehicle, comprises: monitoring at least one battery health parameter in real-time using one or more onboard battery monitoring sensors; determining a threshold of the monitored battery health parameter based on information gathered from vehicle communication network and vehicle operating conditions; defining a battery end-of life prediction algorithm based on a speed of convergence of the monitored battery health parameter to the determined threshold; and estimating an end of life of the battery based on the prediction algorithm. In any or all of the preceding examples, additionally or optionally, the method further comprises, limiting one or more autonomous functions of the vehicle based on the estimating, a degree of the limiting based on the estimated end of life relative to an end of life threshold. In any or all of the preceding examples, additionally or optionally, the method further comprises, limiting one or more non-essential functions, such as an electrically actuated anti-roll control system of the vehicle, based on the estimating, a degree of the limiting based on the estimated end of life relative to an end of life threshold. In any or all of the preceding examples, additionally or optionally, the vehicle is one of a plurality of vehicles in a vehicle fleet, and wherein determining the threshold includes determining the thresholds based on battery end-of-life information gathered from each of the plurality of vehicles of the fleet and received via the vehicle communication network.

An example vehicle system comprises: a battery; one or more sensors coupled to the battery; a motor driven using electrical power drawn from the battery; an engine; a network communicatively coupling the vehicle system to one or more additional vehicles of a fleet; a display; and a controller with computer readable instructions for: predicting a duration remaining until an end of life of the battery based on a rate of convergence of a plurality of sensed battery parameters towards corresponding parameter thresholds, the thresholds determined based on battery history for the vehicle system and each of the one or more additional vehicles of the fleet; comparing the predicted duration to a threshold end of life; and limiting one or more functions of the vehicle based on comparison. In any or all of the preceding examples, additionally or optionally, the controller includes further instructions for: when the predicted duration is higher than the threshold end of life, displaying the predicted duration to a vehicle operator on the display and limiting an autonomous functionality of the vehicle. In any or all of the preceding examples, additionally or optionally, limiting one or more functions of the vehicle based on the comparison includes limiting one or more of a powered steering assist, climate control, and entertainment system operation. In any or all of the preceding examples, additionally or optionally, controller includes further instructions for updating the threshold end of life based on vehicle performance for the vehicle system and each of the one or more additional vehicles of the fleet following the predicting, the threshold end of life lowered responsive to a drop in the vehicle performance.

Note that the example control and estimation routines included herein can be used with various engine and/or vehicle system configurations. The control methods and routines disclosed herein may be stored as executable instructions in non-transitory memory and may be carried out by the control system including the controller in combination with the various sensors, actuators, and other engine hardware. The specific routines described herein may represent one or more of any number of processing strategies such as event-driven, interrupt-driven, multi-tasking, multi-threading, and the like. As such, various actions, operations, and/or functions illustrated may be performed in the sequence illustrated, in parallel, or in some cases omitted. Likewise, the order of processing is not necessarily required to achieve the features and advantages of the example embodiments described herein, but is provided for ease of illustration and description. One or more of the illustrated actions, operations and/or functions may be repeatedly performed depending on the particular strategy being used. Further, the described actions, operations and/or functions may graphically represent code to be programmed into non-transitory memory of the computer readable storage medium in the engine control system, where the described actions are carried out by executing the instructions in a system including the various engine hardware components in combination with the electronic controller.

It will be appreciated that the configurations and routines disclosed herein are exemplary in nature, and that these specific embodiments are not to be considered in a limiting sense, because numerous variations are possible. For example, the above technology can be applied to batteries used for starting, supporting transient loads or propulsion with a variety of chemistries. The subject matter of the present disclosure includes all novel and non-obvious combinations and sub-combinations of the various systems and configurations, and other features, functions, and/or properties disclosed herein.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A method for predicting battery health for a vehicle, comprising:
monitoring a battery health parameter in real-time using one or more onboard battery monitoring sensors;
determining a threshold of the monitored battery health parameter based on vehicle operating conditions and battery end-of-life information gathered from each of a plurality of vehicles of a fleet and received via a vehicle communication network, wherein the vehicle is one of the plurality of vehicles in the fleet, and wherein determining the threshold includes determining that the battery end-of-life information indicates that an initial threshold of the monitored battery health parameter is too high or too low and, in response, adapting the initial threshold based on the battery end-of-life information to determine the threshold of the monitored battery health parameter, wherein adapting the initial threshold based on the battery end-of-life information comprises adding an output of a transfer function to the initial threshold, the transfer function mapping, via an input/output relationship, incremental change in the initial threshold to an incremental change to the battery end-of-life information;
defining a battery end-of life prediction algorithm based on a speed of convergence of the monitored battery health parameter to the determined threshold;
estimating an end of life of the battery based on the prediction algorithm; and
limiting one or more autonomous functions or safety-related functions requiring electrical power of the vehicle based on the estimating, or limiting one or more non-essential electrical power requiring systems of the vehicle based on the estimating.

2. The method of claim 1, wherein limiting the one or more autonomous functions or the safety-related functions requiring the electrical power of the vehicle based on the estimating includes where a degree of the limiting is based on the estimated end of life relative to an end of life threshold.

3. The method of claim 1, wherein limiting the one or more non-essential electrical power requiring systems of the vehicle based on the estimating includes where a degree of the limiting is based on the estimated end of life relative to an end of life threshold, the one or more non-essential electrical power requiring systems of the vehicle including an electrically-actuated anti-roll control system.

4. The method of claim 1 further comprising displaying a confidence level for the estimated end of life of the battery, wherein the confidence level is determined based on machine learning of data from the plurality of vehicles.

5. The method of claim 1, wherein the battery end-of-life information includes a batteries in service metric (BISM), wherein determining that the battery end-of-life information indicates that the initial threshold of the monitored battery health parameter is too high or too low comprises comparing the BISM to a performance metric threshold and determining that the BISM exceeds the performance metric threshold, and wherein adapting the initial threshold based on the battery end-of-life information comprises setting the determined threshold to be lower than the initial threshold.

6. The method of claim 1, wherein the battery end-of-life information includes a false replacement metric (FRM), wherein determining that the battery end-of-life information indicates that the initial threshold of the monitored battery health parameter is too high or too low comprises comparing the FRM to a performance metric threshold and determining that the FRM exceeds the performance metric threshold, and wherein adapting the initial threshold based on the battery end-of-life information comprises setting the determined threshold to be higher that the initial threshold.

* * * * *